(12) United States Patent
Ghorayeb et al.

(10) Patent No.: US 8,249,842 B2
(45) Date of Patent: Aug. 21, 2012

(54) METHOD, SYSTEM AND APPARATUS FOR NUMERICAL BLACK OIL DELUMPING

(75) Inventors: Kassem Ghorayeb, Salwa (KW); Jonathan Holmes, Reading (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 764 days.

(21) Appl. No.: 12/089,287

(22) PCT Filed: Oct. 5, 2006

(86) PCT No.: PCT/US2006/039156
§ 371 (c)(1),
(2), (4) Date: Sep. 10, 2008

(87) PCT Pub. No.: WO2007/142670
PCT Pub. Date: Dec. 13, 2007

(65) Prior Publication Data
US 2009/0150127 A1    Jun. 11, 2009

Related U.S. Application Data

(60) Provisional application No. 60/724,148, filed on Oct. 6, 2005.

(51) Int. Cl.
G06G 7/50       (2006.01)
G06G 7/58       (2006.01)
(52) U.S. Cl. .............................................. 703/9; 703/10
(58) Field of Classification Search .................... 703/10, 703/9
See application file for complete search history.

(56) References Cited

U.S. PATENT DOCUMENTS

| | | | |
|---|---|---|---|
| 5,710,726 A | 1/1998 | Rowney | |
| 6,108,608 A | 8/2000 | Watts, III | |
| 6,662,146 B1 | 12/2003 | Watts | |
| 6,928,399 B1 | 8/2005 | Watts | |
| 7,006,959 B1 | 2/2006 | Huh | |
| 7,379,853 B2 | 5/2008 | Middya | |
| 2002/0013687 A1 | 1/2002 | Ortoleva | |
| 2002/0016703 A1 * | 2/2002 | Barroux | 703/10 |
| 2005/0021869 A1 * | 1/2005 | Aultman et al. | 709/249 |
| 2005/0065759 A1 * | 3/2005 | Barroux | 703/10 |
| 2007/0112547 A1 * | 5/2007 | Ghorayeb et al. | 703/10 |

FOREIGN PATENT DOCUMENTS

| | | |
|---|---|---|
| CA | 2286173 | 8/1999 |
| CA | 2506883 | 6/2004 |
| CA | 2353954 | 7/2007 |
| FR | 2775094 A1 * | 8/1999 |
| WO | 0140937 | 6/2001 |
| WO | 02063130 | 8/2002 |

(Continued)

OTHER PUBLICATIONS

Tingas, J. and Frimpong, R.: "Integrated Reservoir and Surface Network Simulation in Reservoir Management of Southern North Sea Gas Reservoirs", SPE Proceedings, Oct. 20, 1998, 12 pages.

(Continued)

Primary Examiner — David Silver
(74) Attorney, Agent, or Firm — Lam Nguyen

(57) ABSTRACT

A method for black oil delumping is disclosed which comprises: converting a black oil wellstream into a compositional wellstream thereby enabling the composition and component molar rates of a production well in a black oil reservoir simulation to be reconstituted.

9 Claims, 18 Drawing Sheets

FOREIGN PATENT DOCUMENTS

| WO | 2003/006285 | 1/2003 |
|----|-------------|--------|
| WO | 2004049216 | 6/2004 |

OTHER PUBLICATIONS

Trick, M.D.: "A different approach to coupling a reservoir simulator with a surface facilities model", SPE 40001, Mar. 15, 1998, 6 pages.

Haugen, E.D., Holmes, J.A. and Selvig, A.: "Simulation of independent reservoirs coupled by global production and injection constraints", proceedings of the SPE Reservoir Simulation Symposium, Feb. 12, 1995, 13 pages.

Weisenborn, A.J. and Schulte, A.M.: "Compositional Integrated Sub-Surface-Surface Modeling," paper SPE 65158 presented at the SPE European Petroleum Conference, Paris, France, Oct. 24-25, 2000, 12 pages.

Ghorayeb, K., Holmes, J., Torrens, R., and Grewal, B.: "A General Purpose Controller for Coupling Multiple Reservoir Simulations and Surface Facility Networks," paper SPE 79702 presented at the 2003 SPE Reservoir Simulation Symposium, Houston, Texas, Feb. 3-5, 2003, 15 pages.

Barroux, C.C., Duchet-Suchaux, P., Samier, P., and Nabil, R.: "Linking Reservoir and Surface Simulators: How to Improve the Coupled Solutions," paper SPE 65159 presented at the SPE European Petroleum Conference, Paris, France, Oct. 24-25, 2000, 14 pages.

Briens et al., "Application of sequential staging of tasks to petroleum reservoir modeling", IEEE 1990, Nov. 12-16, 1990, pp. 428-435.

Scott et al., "Application of parallel (MIMD) computers to reservoir simulation", SPE 16020, 1987.

Leibovici, et al., "A consistent procedure for pseudo-component delumping" Fluid Phase Equilibria, Elsevier Scientific Publishing Company, Amsterdam, NL, vol. 117, 1996, pp. 225-232, XP002083980.

* cited by examiner

METHOD, SYSTEM AND APPARATUS FOR NUMERICAL BLACK OIL DELUMPING

CROSS REFERENCE TO RELATED APPLICATIONS

This application claims the benefit of U.S. Provisional Application No. 60/724,148, filed Oct. 6, 2005, and is a continuation-in-part of U.S. application Ser. No. 10/586,283, which was the National Stage of International Application No. PCT/US02/37658, filed Nov. 23, 2002.

BACKGROUND

The subject matter of this specification relates to a method, including an associated system or apparatus and computer program and program storage device, for Black Oil Delumping that is used to convert wellstreams from a black oil simulation into their constituent components when a compositional representation of the wellstreams is required.

Black oil reservoir simulation still has wide application in the petroleum industry because it is computationally far less demanding than compositional simulation. However, a principal limitation of black oil reservoir simulation is that it does not provide detailed compositional information necessary for surface process modeling. Black oil delumping overcomes this limitation by converting a black oil wellstream into a compositional wellstream thereby enabling the composition and component molar rates of a production well in a black oil reservoir simulation to be reconstituted. This specification discloses a comprehensive black oil delumping method based primarily on the compositional information generated in a depletion process that is used initially to provide data for the black oil simulation in a typical workflow. Examples disclosed in this specification show the accuracy of this method in different depletion processes including: natural depletion, water injection, and gas injection. The specification also presents a technique for accurately applying the black oil delumping method to wells encountering crossflow.

SUMMARY

One aspect of the present invention involves a method for black oil delumping, comprising: converting a black oil wellstream into a compositional wellstream thereby enabling a set of composition and component molar rates of a production well in a black oil reservoir simulation to be reconstituted.

Another aspect of the present invention involves a program storage device readable by a machine tangibly embodying a set of instructions executable by the machine to perform method steps for black oil delumping, the method steps comprising: converting a black oil wellstream into a compositional wellstream thereby enabling a set of composition and component molar rates of a production well in a black oil reservoir simulation to be reconstituted.

Another aspect of the present invention involves a system adapted for black oil delumping, comprising: first apparatus adapted for converting a black oil wellstream into a compositional wellstream thereby enabling a set of composition and component molar rates of a production well in a black oil reservoir simulation to be reconstituted.

Another aspect of the present invention involves a computer program adapted to be executed by a processor, the computer program, when executed by the processor, conducting a process for black oil delumping, the process comprising: converting a black oil wellstream into a compositional wellstream thereby enabling a set of composition and component molar rates of a production well in a black oil reservoir simulation to be reconstituted.

Further scope of applicability will become apparent from the detailed description presented hereinafter. It should be understood, however, that the detailed description and the specific examples set forth below are given by way of illustration only, since various changes and modifications within the spirit and scope of the 'Black Oil Delumping' method, as described and claimed in this specification, will become obvious to one skilled in the art from a reading of the following detailed description.

BRIEF DESCRIPTION OF THE DRAWINGS

A full understanding will be obtained from the detailed description presented hereinbelow, and the accompanying drawings which are given by way of illustration only and are not intended to be limitative to any extent, and wherein.

DETAILED DESCRIPTION

Figure 1:
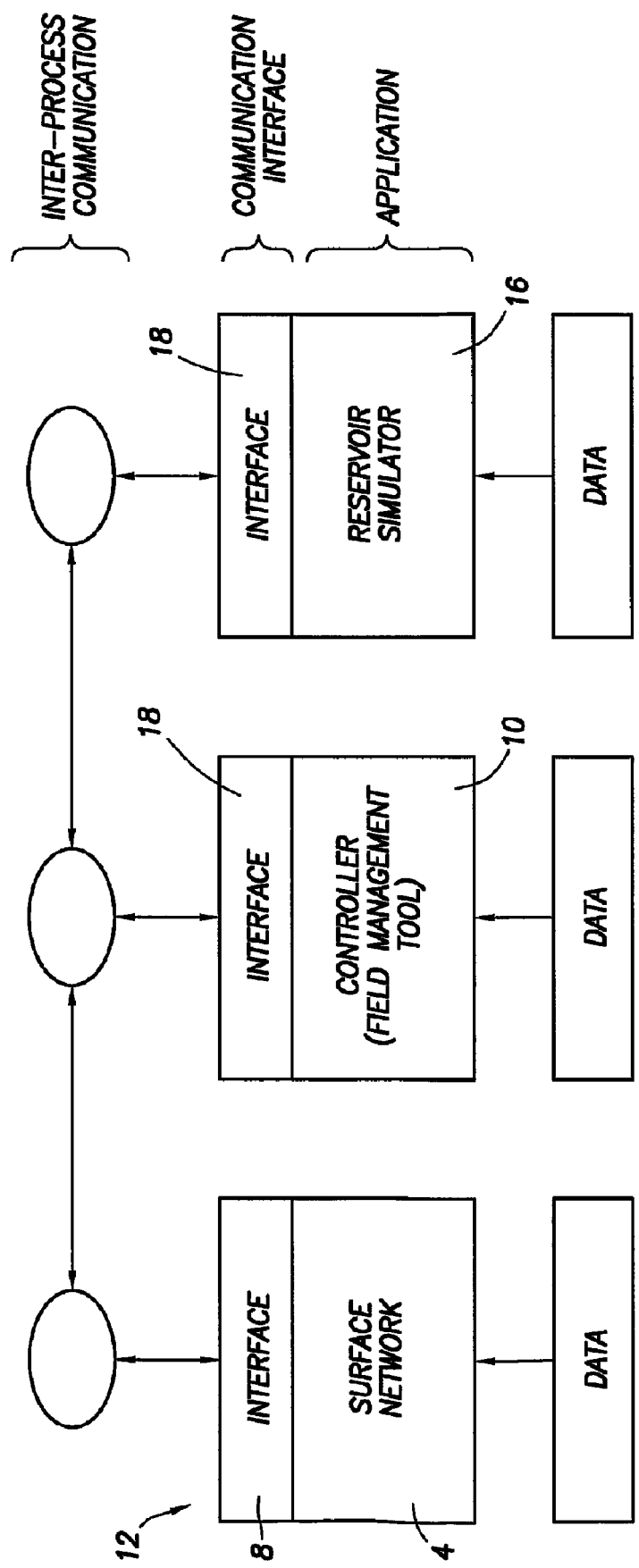
FIG. 1 illustrates a general purpose multi-platform reservoir and network coupling controller in a coupled reservoir/network system adapted for analyzing a pressure interaction between a reservoir and a constrained surface facility network or for predicting the behavior of several fields, which may have different fluid compositions, sharing a common surface facility.

Referring to FIG. 1, a general purpose multi-platform reservoir and network coupling controller 10 in a coupled reservoir/network system 12, representing an integrated surface and subsurface modeling system 12, is illustrated. The coupling controller 10 is adapted for analyzing a pressure interaction between a reservoir simulator 16 and a constrained surface facility network 14 or for predicting a behavior of several reservoir fields which may have different fluid compositions and share a common surface facility. The reservoir and network coupling controller 10 in the coupled reservoir/network system 12 of FIG. 1 is fully described and set forth in International Publication number WO2004/049216 A1, published Jun. 10, 2004, based on International Application number PCT/US2002/037658 filed Nov. 23, 2002, the disclosure of which is incorporated by reference into the specification of this application.

The 'Controller' 10 is a 'Field Management' system, and its task is to apply time-dependent controls and operations on the production and injection wells in one or more reservoir simulation models. In addition to the reservoir simulation models, the controller 10 may also communicate with one or more surface facility models 14 (such as a pipeline network model), since conditions on this part of the integrated system may feed back as constraints on the wells in the reservoir simulation models 16. One way that the controller 10 communicates with the other software applications is detailed in the International Publication number WO2004/049216 A1 referenced above.

In FIG. 1, the coupling controller 10 (a Field Management Tool) communicates with a selection of reservoir simulators 16 and surface network simulators 14 via a communication interface 18. The controller 10 manages the balancing of the reservoirs and surface networks and synchronizes their advancement through time. The controller 10 also applies the global production and injection restraints, and converts the hydrocarbon fluid streams between the different sets of pseudo-components used in the simulation models. In FIG. 1, the integrated surface and subsurface modeling system 12 of FIG. 1 includes a multi-platform reservoir and network coupling controller 10 that is adapted for affecting reservoir field development and optimization by analyzing a pressure interaction between a reservoir 16 and a constrained surface facility network 14 or by predicting a behavior of several reservoir fields which may have different fluid compositions sharing a common surface facility. The controller 10 practices a method for integrated reservoir and surface facility network simulations which includes: communicating between the multi-platform reservoir and network coupling controller 10 and at least one reservoir simulator 16 and between the controller 10 and at least one surface network simulator 14 (hereinafter called the 'communicating step'). The surface and subsurface modeling system 12 includes a communication interface 18 which is associated with the reservoir simulator 16 and the controller 10 and the surface network simulator 14, the communication interface 18 being adapted for managing a balancing of the reservoir simulator 16 and the surface network simulator 14 and synchronizing the advancement of the reservoir simulator 16 and the surface network simulator 14 through time. The above referenced communicating step includes communicating, by the controller 10, with the reservoir simulator 16 and the surface network simulator 14 via the communication interface 18, the interface 18 enabling the reservoir simulator 16 application and the surface network simulator 14 application to exchange data. When the communication interface 18 is enabled, the controller 10 is adapted to engage in a defined dialog with the reservoir simulator 16 and the surface network simulator 14, the dialog including executive commands, set commands, and query commands. In addition, the communicating step includes coupling the reservoir simulator 16 to the surface network simulator 14. The coupling step includes coupling, by the controller 10, a single reservoir simulator model 16 to the surface network simulator 14 application. When the controller 10 couples the single reservoir simulator model 16 to the surface network simulator 14 application, a tight iteratively lagged coupling scheme is applied, the tight coupling scheme balancing the network simulator application 14 with the reservoir simulator application 16 at each Newton iteration of the reservoir simulator's time step calculation. The coupling step further includes coupling, by the controller 10, two or more reservoir simulator models 16 to the surface network simulator application 14. The two or more reservoir simulator models 16 are subject to common global constraints, and, when the controller 10 couples the two or more reservoir simulator models 16 that are subject to common global constraints to the surface network simulator application 14, a loose coupling scheme is applied wherein, during the loose coupling scheme, the reservoir simulator models 16 are balanced with respect to their global constraints at the start of each synchronization step in the controller 10 and, thereafter, each reservoir simulator model 16 advances independently to a start of a next synchronization step.

Figure 2:
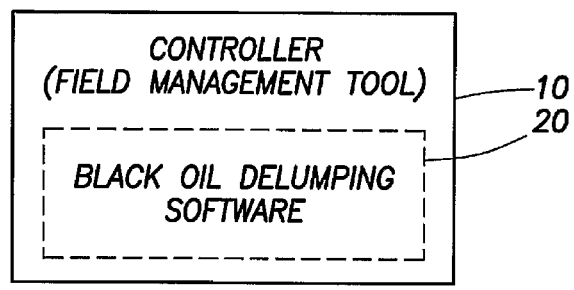
FIG. 2 illustrates the reservoir and network coupling controller of FIG. 1, where the controller includes a Black Oil Delumping Software adapted for practicing a Black Oil Delumping method that is used to convert wellstreams from a black oil simulation into their constituent components when a compositional representation of the wellstreams is required.

Referring to FIG. 2, the controller 10 of FIG. 1 includes a 'Black Oil Delumping software' 20 adapted for practicing a 'Black Oil Delumping method' that is used to convert wellstreams from a black oil simulation (i.e., the 'black oil wellstream') into their constituent components (i.e., a 'compositional wellstream') when a compositional representation of the wellstreams is required. Once the 'black oil wellstream' is delumped into a 'compositional wellstream', that is, when the 'component molar rates' are calculated, the 'compositional wellstream' can be used for different purposes that include: (1) Feeding, as input, a process facility simulator since compositional information is generally a requirement for these simulators, and/or (2) In the case where a black oil simulator, such as the reservoir simulator 16 of FIG. 1, is coupled to a compositional network simulator, such as the surface network simulator 14 of FIG. 1, the delumped compositional stream is used to provide the network simulator 14 with 'input data' (e.g., with 'compositional boundary conditions'). In FIGS. 1 and 2, the need for 'Black Oil Delumping' would arise in the following context: one or more of the reservoir simulation models 16 may have a 'black oil fluid description' for computational efficiency. However, the controller 10 may require a 'compositional fluid description' of this fluid in order to be consistent with the 'fluid descriptions' in the other models to which it couples, such as the 'surface network model' 14. Or, the controller 10 may be required to output a 'compositional fluid description', where the 'compositional fluid description' is provided, as input data, to a 'process facility model'.

Figure 3:
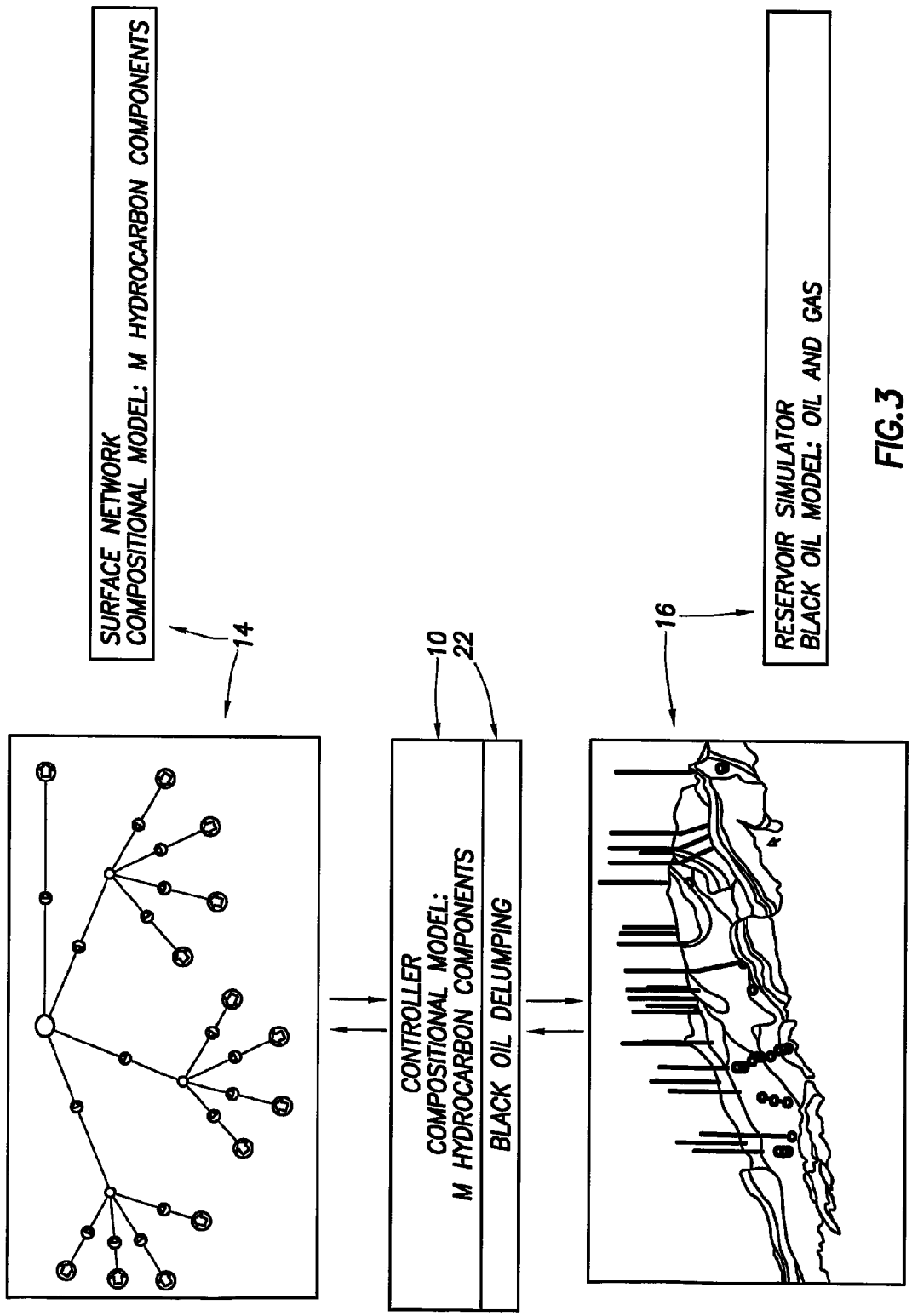
FIGS. 3, 4, and 5 illustrate an integrated system which represents the coupled reservoir/network system of FIGS. 1 and 2, wherein, for example, the coupling controller converts a black oil fluid description from a reservoir simulator into a compositional fluid description for use by a surface network model, such as the surface network model of FIG. 1.
Figure 4:
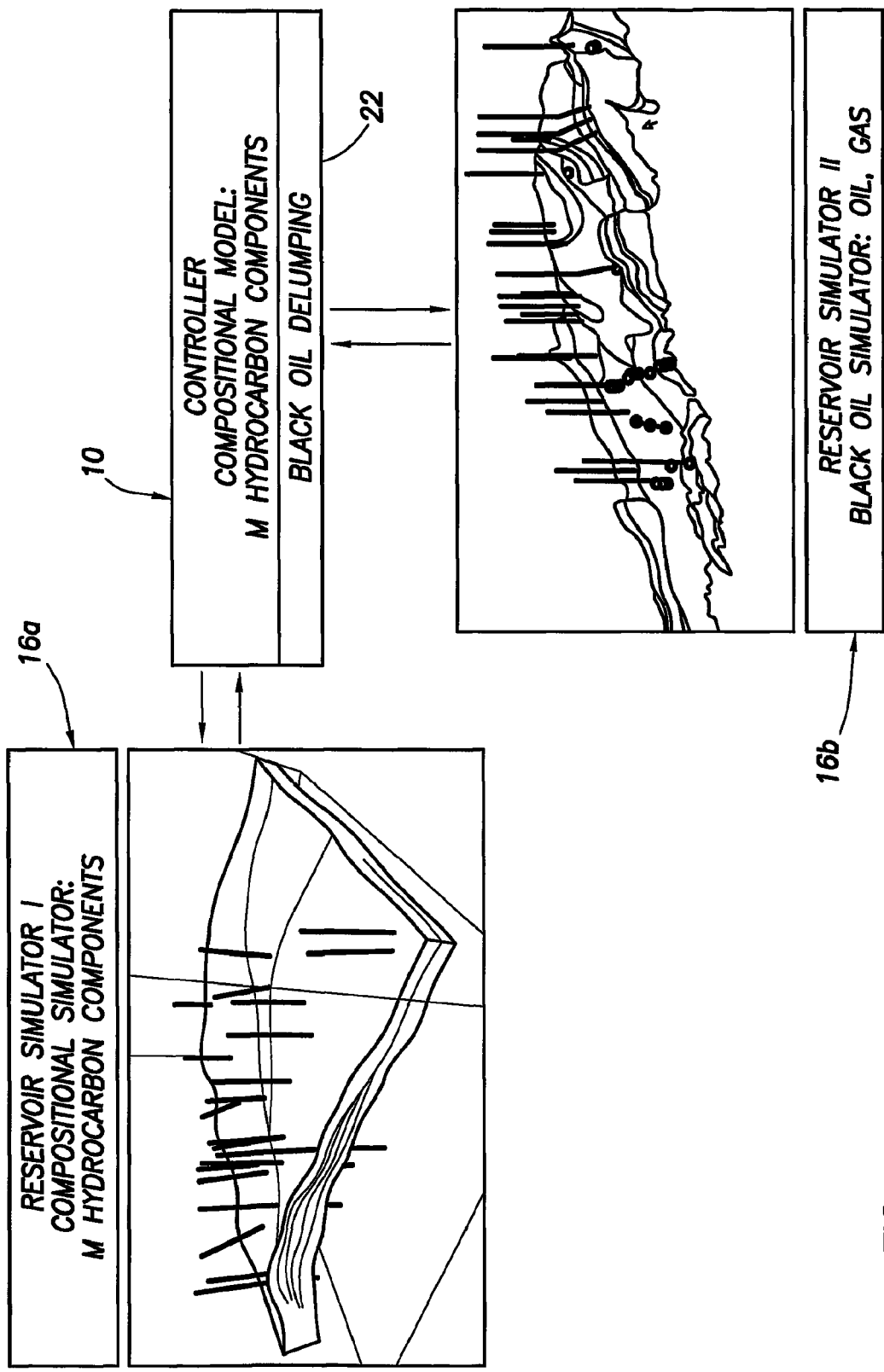

Referring to FIG. 3, by way of example, the controller 10 converts the 'black oil model' from the reservoir simulator 16 into a 'compositional model' (having M hydrocarbon components) for the surface network 14. The aforementioned conversion is accomplished by the 'black oil delumping method' 22 as shown in FIG. 3 which is practiced by the 'Black Oil Delumping software' 20 of FIG. 2. Referring to FIG. 4, by way of example, the controller 10 also 'converts' the 'black oil model' from the 'black oil simulator' 16b represented by reservoir simulator (2) 16b into a 'compositional model'; however, this 'conversion' takes place so that the fluid from the 'black oil simulator' 16b is converted into the same set of components as the compositional reservoir simulator 16a represented by reservoir simulator (1) 16a. The controller 10 then uses a unified fluid model for the co-mingled production from both reservoirs. This 'conversion' is accomplished by the 'black oil delumping method' 22 of FIG. 4 which is practiced by the 'Black Oil Delumping software' 20 of FIG. 2.

Figure 5:
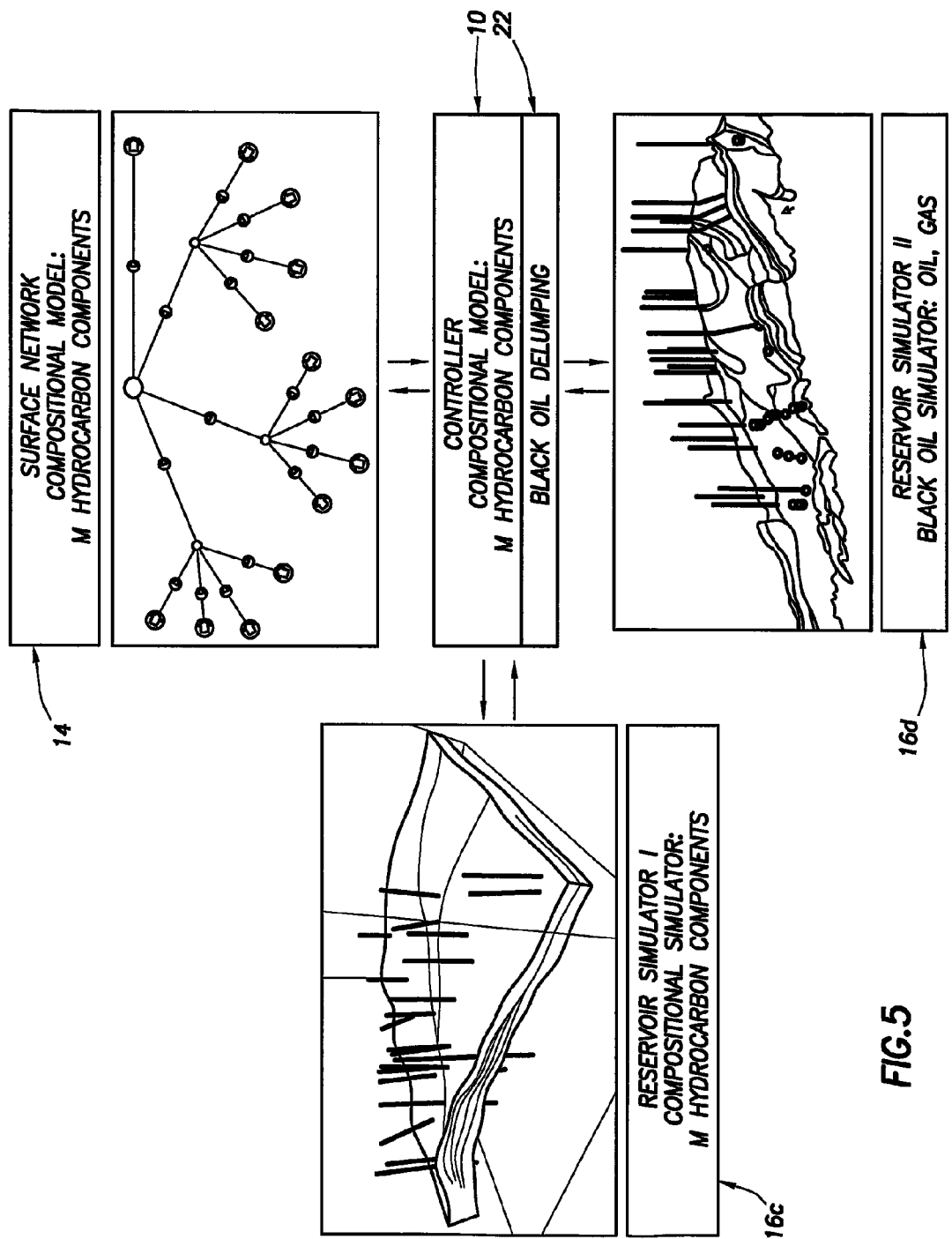

Referring to FIG. 5, by way of example, the controller 10 converts the 'black oil model' from the black oil simulator 16d represented by the reservoir simulator (2) 16d into a 'compositional model'; however, this 'conversion' takes place so that the fluid from the 'black oil simulator' 16d is converted into the same set of components as the compositional reservoir simulator 16c. The controller 10 then uses a unified fluid model for the co-mingled production from both reservoirs and communicates the resulting component molar rates to the surface network simulator 14. The aforementioned conversions are accomplished by the 'black oil delumping method' 22 as shown in FIG. 5 which is practiced by the 'Black Oil Delumping software' 20 of FIG. 2.

The 'Black Oil Delumping Software' 20 of FIG. 2

As noted above, the controller 10 of FIGS. 1 and 2 includes a 'Black Oil Delumping software' 20 that is adapted for practicing a 'Black Oil Delumping method' that is used to convert wellstreams from a black oil simulation (i.e., a 'black oil wellstream') into their constituent components (i.e., a 'compositional wellstream) when a compositional representation of the wellstreams is required. The 'black oil wellstream' is delumped into the 'compositional wellstream' when the 'component molar rates' are calculated.

In the following paragraphs of this specification, the 'Black Oil Delumping software' 20 of FIG. 2 that practices the aforementioned 'Black Oil Delumping method' will be discussed in greater detail with reference to FIGS. 6 through 19 of the drawings. A 'Black Oil Delumping method' converts a 'black oil wellstream' into a 'compositional wellstream' thereby enabling the composition and component molar rates of a production well in a black oil reservoir simulation to be reconstituted. The 'black oil delumping method' is based primarily on compositional information generated in a depletion process that is used initially to provide data for a black oil simulation in a typical workflow. Examples show the accuracy of this black oil delumping method in different depletion processes, such as natural depletion, water injection, and gas injection. In addition, a method for accurately applying the black oil delumping method to wells encountering crossflow is also disclosed.

With advances in computing speed, it is becoming more usual to employ a fully compositional fluid description in hydrocarbon reservoir simulation. However, the faster computers become, the stronger is simulation engineers' tendency to build more challenging, and thus more CPU intensive, models. Compositional simulation in today's multi-million-cell models is still practically unfeasible.

Black oil fluid representation is a proven technique that continues to find wide application in reservoir simulation. However, an important limitation of black oil reservoir simulation is the lack of detailed compositional information necessary for surface process modeling. The 'black-oil delumping' technique described in this specification provides the needed compositional information, yet adds negligible computational time to the simulation.

Delumping a black oil wellstream consists of retrieving the detailed components' molar rates to convert the 'black oil wellstream' into a 'compositional wellstream'. It reconstitutes the composition and component molar rates of the production stream.

Black oil delumping can be achieved with differing degrees of accuracy by using options ranging from setting constant oil and gas composition for the whole run to using the results of a depletion process (CVD, CCD, DL, . . . ).

The simplest method is to assign a fixed composition (component mole fraction) to stock-tank oil and gas. This could be applied over the whole reservoir or, if the hydrocarbon mixture properties vary across the reservoir, different oil and gas compositions can be reassigned at any time during the run.

Some black oil simulators have an API tracking feature that allows oils of different properties to mix within the reservoir. The PVT properties of the oil mixture are parameterized using the oil surface density. To provide a delumping option compatible with the API tracking, stock-tank oil and gas compositions may be tabulated against the density of oil at surface conditions.

The third option, which offers the greatest accuracy, is to provide tables of reservoir liquid and vapor component mole fractions vs. saturation pressure. These can be obtained from a depletion process, ideally the same process that was initially used to generate the black oil PVT tables. This technique, as we show in this specification, provides very accurate results in natural depletion processes and production processes involving reservoir re-pressurization by water-injection. Weisenborn and Schulte[1] (see references below) reported a similar delumping technique. However, they used the grid-block pressure instead of saturation pressure (or averaged saturation pressure in the case of a well-completion spanning multiple grid-cell connections) in the delumping scheme. The latter, as we will show, provides better results in the case of production processes involving reservoir re-pressurization by water injection.

Black oil delumping based on composition vs. saturation pressure tables may not provide an accurate wellstream composition in production processes involving gas injection. This is the case when the depletion experiment, and consequently the resulting tabulated vapour and liquid composition vs. saturation pressure, may not adequately account for the proportion and composition of injected gas in the wellstream. In this situation, using tables of liquid and vapor composition vs. the liquid phase's gas/oil ratio ($R_s$) and/or the vapor phase's oil/gas ratio ($R_v$) for the delumping process improves accuracy, as we illustrate.

Another important aspect of black oil delumping is the level at which delumping takes place: the well level or the completion level.

Delumping at the completion level could be necessary in the case of reservoirs with multiple PVT description regions, because different completions in the same well may be located in different PVT regions. This will be discussed later in this specification.

Finally, special care should be taken in the case of production wells experiencing crossflow, where some of the fluid mixture in the wellbore is re-injected into low-pressure layers. The "injection" rate in these completions should be accounted for appropriately as described later.

Formulation

The following formulation applies to black oil delumping both at the well level and well-completion level. Here we describe delumping methods that use one of the following tables:

Liquid/vapor composition vs. liquid/vapor mass rate averaged saturation pressure; that is, the average of the saturation pressure over all the well's (or completion's) grid-cell connections, weighted by the connection's liquid/vapor mass rate. This is mainly suitable for natural-depletion production processes and processes involving water-injection. Note that, when the completion spans just a single grid cell, the average saturation pressure of the completion reduces to the saturation pressure of the fluid in the grid cell.

Oil/gas composition vs. oil surface density. This is mainly suitable for API tracking black oil models (allowing mixing of different types of oil with different surface densities and PVT properties).

Liquid/vapor composition vs. $R_s$ and/or $R_v$. This is mainly suitable for production processes involving gas-injection.

The formulation considers the general context of a live-oil/wet-gas black oil model. Black oil delumping for simpler black oil models (i.e. live-oil/dry-gas and dead-oil/dry-gas models) is a particular case of this general formulation.

The purpose of the delumping process is to retrieve the component mole fraction (total composition) $z_i$, $i=1, \ldots, N^c$, where $N^c$ is the number of components. The component molar rate $n_i$, $i=1, \ldots, N^c$ is then simply the product of the total molar rate multiplied by the component's mole fraction. In the following calculations, liquid and vapor refer to the hydrocarbon phases existing at reservoir conditions, while oil and gas refer to hydrocarbon phases at stock-tank conditions.

The delumping process comprises the following three steps:

Step 1. Phase Mass Rate Calculation

From mass conservation, the mass rates of the vapor and liquid phases, respectively, are given by:

$$Q_m^V = Q_m^{gV} + Q_m^{oV}, \quad (1)$$

and $$Q_m^L = Q_m^{oL} + Q_m^{gL}, \quad (2)$$

In Equations (1) and (2), the symbols $Q_m^{gV}$, $Q_m^{oV}$, $Q_m^{oL}$ and $Q_m^{gL}$ denote the mass rates of the free gas, vaporized oil, liquid oil, and dissolved gas respectively. These quantities can be obtained from:

$$Q_m^{gV} = \rho^g q^{gV}, \quad (3)$$

$$Q_m^{oV} = \rho^o q^{oV}, \quad (4)$$

$$Q_m^{oL} = \rho^o q^{oL}, \quad (5)$$

and, $$Q_m^{gL} = \rho^g q^{gL} \quad (6)$$

In the above, $q^{gV}$, $q^{oV}$, $q^{oL}$, and $q^{gL}$ denote the free-gas, vaporized-oil, liquid-oil, and dissolved-gas surface volume rates respectively; $\rho^g$ and $\rho^o$ are the surface gas and oil densities, respectively.

Step 2. Phase Composition Calculation

The phase component mole fraction (vapor and liquid component mole fractions $y_i$ and $x_i$, $i=1, \ldots, N^c$) calculation takes place through a table lookup. First, the quantity upon which tables are based is calculated (if needed):

The liquid (vapor) mass-rate-averaged saturation pressure.

The liquid-phase gas/oil ratio ($R_s = q^{gL}/q^{oL}$) and/or the vapor-phase oil/gas ratio ($R_v = q^{oV}/q^{gV}$).

Once this is done, table lookup is performed to obtain the vapor and liquid compositions.

Step 3. Total Composition and Component Molar Rates Calculation

The total composition $z_i$ of component i ($i=1, \ldots, N^c$) is related to the vapor and liquid component mole fractions $y_i$ and $x_i$, respectively, by:

$$z_i = \alpha y_i + (1-\alpha) x_i, \quad (7)$$

where $\alpha$ is the vapor fraction defined by:

$$\alpha = \frac{n^V}{n^V + n^L}; \quad (8)$$

$n^V$ and $n^L$ are the total number of moles in the vapor and liquid phases respectively. Equation (8) can be written as:

$$\alpha = \frac{m^V / M^V}{m^V / M^V + m^L / M^L}; \quad (9)$$

$m^V$, $M^V$, $m^L$ and $M^L$ are the mass and molar weight of the vapor and liquid phases respectively. In terms of molar rates, $\alpha$ can be written as:

$$\alpha = \frac{Q_m^V / M^V}{Q_m^V / M^V + Q_m^L / M^L}; \quad (10)$$

$Q_m^V$ and $Q_m^L$ are calculated as described above. The vapor and liquid molar weights $M^V$, and $M^L$, respectively, are given by:

$$M^V = \sum_{i=1}^{N^o} y_i M_i, \quad (11)$$

and $$M^L = \sum_{i=1}^{N^c} x_i M_i \quad (12)$$

Knowing the total composition, the vapor (liquid) mass rate of component i, $i=1, \ldots, N^c$ is the product of the total vapor (liquid) mass rate multiplied by the component's vapor (liquid) mole fraction $y_i$ ($x_i$).

Having calculated the component mole fractions $z_i$, $i=1, \ldots, N^c$, the component molar rates $n_i$, $i=1, \ldots, N^c$ are straightforwardly calculated: $n_i = (n_V + n_L) z_i$, $i=1, \ldots, N^c$.

Black Oil Delumping at the Completion Level

A well connects with the simulation grid through a set of grid-cell connections. For the purpose of modeling workover operations, the simulator can lump connections together into completions; all the connections in the same completion are opened or closed together. In the case where crossflow occurs in a production well, some of the connections might be injecting instead of producing. Even within the same completion, some connections might be producing and others might be injecting (especially if connections in different poorly-communicating reservoir layers are lumped into the same completion). A completion in a production well might therefore have an injection rate as well as a production rate. The completion injection rate should thus be accounted for when calculating the production well's component molar rates based on those obtained by delumping each completion's black oil stream into a compositional stream.

Consider a well that has n completions. Generally, some (or all) of the connections in a completion may be injecting due to crossflow. Both oil and gas injection may be taking place in the injecting connections.

In a wet-gas/live-oil black oil model, let $q_{Pk}^{gV}$, $q_{Pk}^{oV}$, $q_{Pk}^{oL}$ and $q_{Pk}^{gL}$ denote the free-gas, vaporized-oil, liquid-oil and dissolved-gas production surface volume rates, respectively, for completion k. These are the flow rates from the producing connections in the given completion.

Let $q_P^g$ and $q_P^o$ denote the "gross" surface volume gas and oil "production rates" of the production well, respectively defined as:

$$q_P^g = \sum_{k=1}^{n} (q_{Pk}^{gV} + q_{Pk}^{gL}), \quad (13)$$

$$q_P^o = \sum_{k=1}^{n} (q_{Pk}^{oL} + q_{Pk}^{oV}) \quad (14)$$

In the following, we assume that $q_P^g$ and $q_P^o$ are both $>0$ (for a production well). Let $q_{Ik}^g$ and $q_{Ik}^o$ denote the surface volume gas and oil injection rates of completion k, respectively. These are the flow rates of the injecting connections in the given completion.

Let $q_I^g$ and $q_I^o$ denote the surface volume gas and oil "injection rates" of the production well, respectively:

$$q_I^g = \sum_{i=1}^{n} q_{Ik}^g, \quad (15)$$

$$q_I^o = \sum_{i=1}^{n} q_{Ik}^o \quad (16)$$

Let $q^g$ and $q^o$ denote the "net" surface volume gas and oil production rates of the production well. $q^g$ and $q^o$ are both $\geq 0$ (for a production well).

$$q^g = q_P^g - q_I^g = \sum_{k=1}^{n} (q_{Pk}^{gV} + q_{Pk}^{gL} - q_{Ik}^g), \quad (17)$$

$$q^o = q_P^o - q_I^o \sum_{k=1}^{n} (q_{Pk}^{oL} + q_{Pk}^{oV} - q_{Ik}^o) \quad (18)$$

In a black oil delumping process at the completion level, the completions' production rates should be adjusted to account for the well's injecting connections. The well's injection rates $q_I^g$ and $q_I^o$ are apportioned among all producing completions according to their overall production rates.

Let $q_{ak}^{gV}$, $q_{ak}^{oV}$, $q_{ak}^{oL}$ and $q_{ak}^{gL}$ denote the adjusted values of $q_{Pk}^{gV}$, $q_{Pk}^{oV}$, $q_{Pk}^{oL}$ and $q_{Pk}^{gL}$, respectively. These adjusted values should satisfy:

$$q^g = \sum_{k=1}^{n} (q_{ak}^{gV} + q_{ak}^{gL}), \quad (19)$$

$$q^o = \sum_{k=1}^{n} (q_{ak}^{oL} + q_{ak}^{oV}) \quad (20)$$

The following thus apply:

$$q_{ak}^{gV} = \left(1 - \frac{q_I^g}{q_P^g}\right) q_{Pk}^{gV}, \quad (21)$$

$$q_{ak}^{gL} = \left(1 - \frac{q_I^g}{q_P^g}\right) q_{Pk}^{gL}, \quad (22)$$

$$q_{ak}^{oL} = \left(1 - \frac{q_I^o}{q_P^o}\right) q_{Pk}^{oL}, \quad (23)$$

$$q_{ak}^{oV} = \left(1 - \frac{q_I^o}{q_P^o}\right) q_{Pk}^{oV} \quad (24)$$

Note that since $q^g = q_P^g - q_I^g$ is $\geq 0$ in a production well, $(1 - q_I^g/q_P^g)$ is always $\leq 1$. The same applies for $(1 - q_I^o/q_P^o)$. This implies that $q_{ak}^{gV}$, $q_{ak}^{oV}$, $q_{ak}^{oL}$ and $q_{ak}^{gL}$ are all $\geq 0$.

Delumping Procedure

The ECLIPSE black oil and compositional reservoir simulator is used in this specification. The 'Eclipse' simulator is owned and operated by Schlumberger Technology Corporation of Houston, Tex. Black oil delumping in this specification is performed using the Reservoir to Surface Link software, R2SL®, which is linked to ECLIPSE through an open interface.[2,3] (see references below). The following is a brief description of the procedure it uses to implement black oil wellstream delumping at the well level. The black oil delumping method uses liquid (vapor) composition vs. saturation pressure tables. Similar processes are used for the other delumping methods.

Queries the well's information specifically needed for black oil wellstream delumping (as described in the equations above). This information includes:
Free and solution gas and oil rates.
Surface gas and oil densities.
Average saturation pressure in the well's connected grid blocks weighted by liquid mass inflow rate.
Average saturation pressure in the well's connected grid blocks weighted by vapor mass inflow rate.
Uses the well's vapor (liquid) composition vs. dewpoint (bubblepoint) pressure table to calculate vapor (liquid) component mole fractions (composition). Having only one row in the table implies a constant vapor (liquid) composition vs. saturation pressure.
Calculates vapor and liquid molar weights based on the calculated vapor and liquid compositions using Eqs. 11 and 12.
Calculates vapor and liquid mass rates using Eqs. 1 to 6.
Calculates vapor faction, based on Eq. 10.
Calculates total composition and component molar rates using Eq. 7.

Example Applications

We present a set of examples in which we investigate the accuracy of the delumping technique for a variety of production processes and reservoir behaviors:

Reservoir re-pressurization through water injection (Example 1).
Reservoirs with multiple fluid regions (Example 2).
Wells encountering crossflow (Example 3).
Gas injection. (Example 4).
The validation process principally involves comparing the well composition over time from a compositional reservoir model with the delumped black oil wellstream from an equivalent black oil model.

In all examples (unless indicated otherwise), the following descriptions apply:

The reservoir has three layers.

The reservoir has seven producers (with different drawdowns) and three water injectors.

The reservoir temperature is fixed at 284° F.

The same set of components/pseudo-components is present.

The two-parameter Peng-Robinson equation of state is used in the compositional models as well as in the depletion processes used to generate the black oil models' PVT properties.

A constant-volume depletion scheme (CVD) is used to construct the black oil model.

The oil production rate of the reservoir is fixed to 5000 STB/D. Wells are set to produce, when possible, with equal shares of the field's oil production limit.

The fluid in the reservoir is initially liquid (the pressure is higher than the bubble point pressure in every layer of the reservoir).

The following economic limits apply to the production wells:

Minimum oil production rate of 250 STB/D.

Maximum water cut of 0.7.

Maximum gas/oil ratio (GOR) of 5.0.

Figure 6:
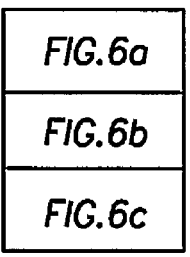
FIG. 6 illustrates a phase plot for the fluids used in the examples.
Figure 7:
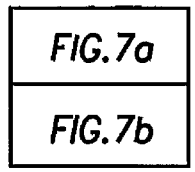
FIG. 7 including

Refer now to FIG. 6. Refer also to 'Table 1' which is set forth below at the end of this specification.

Table 1 shows the set of components/pseudo-components and the fluid compositions used in the following examples. In FIG. 6, pressure/temperature diagrams corresponding to these compositions are depicted in FIG. 6. Examples 1, 3 and 4 use Fluid 1 while different layers are initialized with different fluids in Example 2.

Example 1

Water Injection

This example shows that delumping using composition vs. saturation pressure tables provides highly accurate results in natural depletion processes and production processes involving reservoir re-pressurization using water injection.

Delumping in this example takes place at the well level. We compared these results with those obtained by delumping at the completion level and observed no significant difference. Note that each completion consists of a single grid-cell connection in this example (as is also the case in all other examples).

The initial composition for this example is that of Fluid 1 (see Table 1). The initial pressure in the reservoir is 5000 psi. The entire reservoir is initially in the liquid phase (undersaturated). Oil is produced at a constant total rate of 2500 STB/D through seven wells.

A CVD depletion process was used to build the live-oil/wet-gas black oil model. We also tried using a black oil model containing dry gas (instead of wet gas), but this gave a significant discrepancy in the gas breakthrough time and the composition of the delumped black oil wellstream. This is to be expected, since quality of the delumped results is directly related to quality of the black oil model.

A natural depletion process is applied for the first 3 years. Re-pressurization by water injection, injecting twice the reservoir volume of the produced fluids, is applied over the remaining production time (5 years).

Figure 7A:
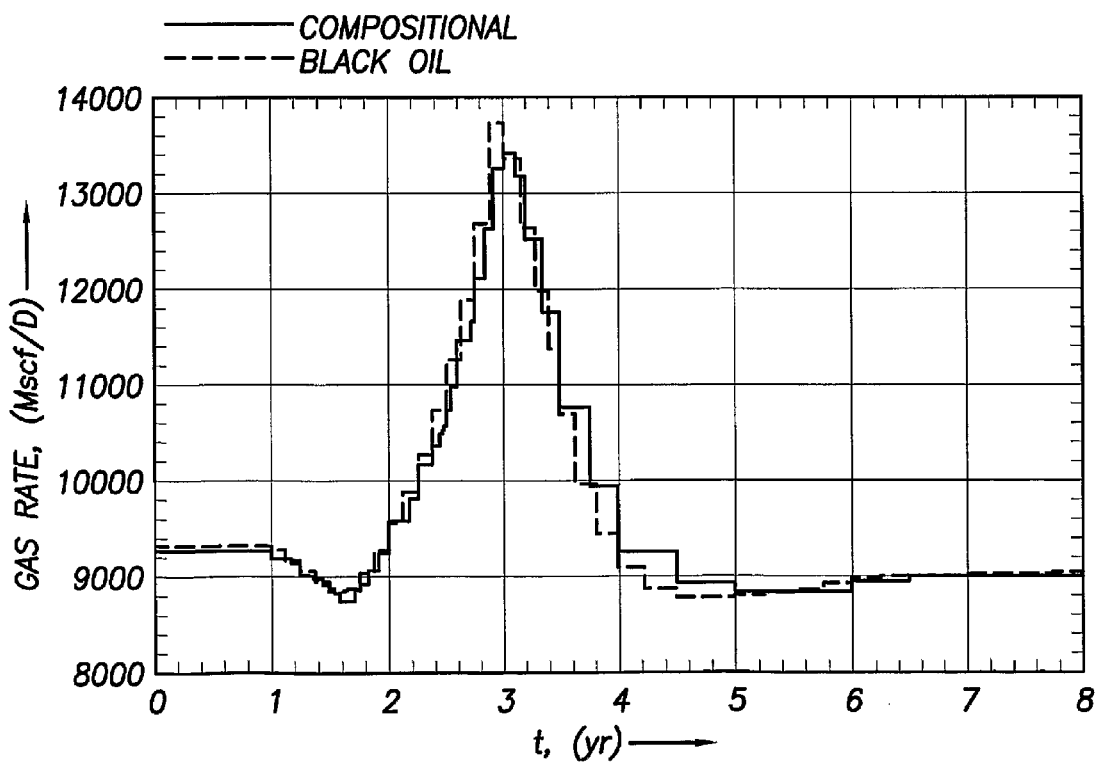
FIGS. 7a and 7b illustrates example 1.

Refer to FIG. 7(a)

The average reservoir pressure decreases to approximately 4200 psi at the end of the third year and increases back to around 4500 psi (which is above the bubblepoint pressure) at the end of the seventh year, as shown in FIG. 7(a). Note that re-pressurization of the reservoir by water injection is accounted for in the delumping process by using the hydrocarbon liquid/vapor composition vs. liquid/vapor phases' averaged saturation pressures instead of using the well's "average pressure" (see Appendix A set forth below). When the pressure increases in a grid cell due to water injection, the saturation pressure does not increase correspondingly; therefore, using the pressure instead of the saturation pressure can result in a substantially erroneous delumped black oil stream.

Figure 8:
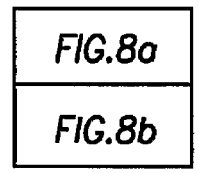
FIG. 8 illustrates example 1, delumped composition.
Figure 9:
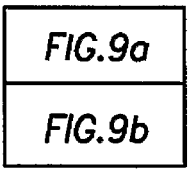
FIG. 9 including
Figure 7B:
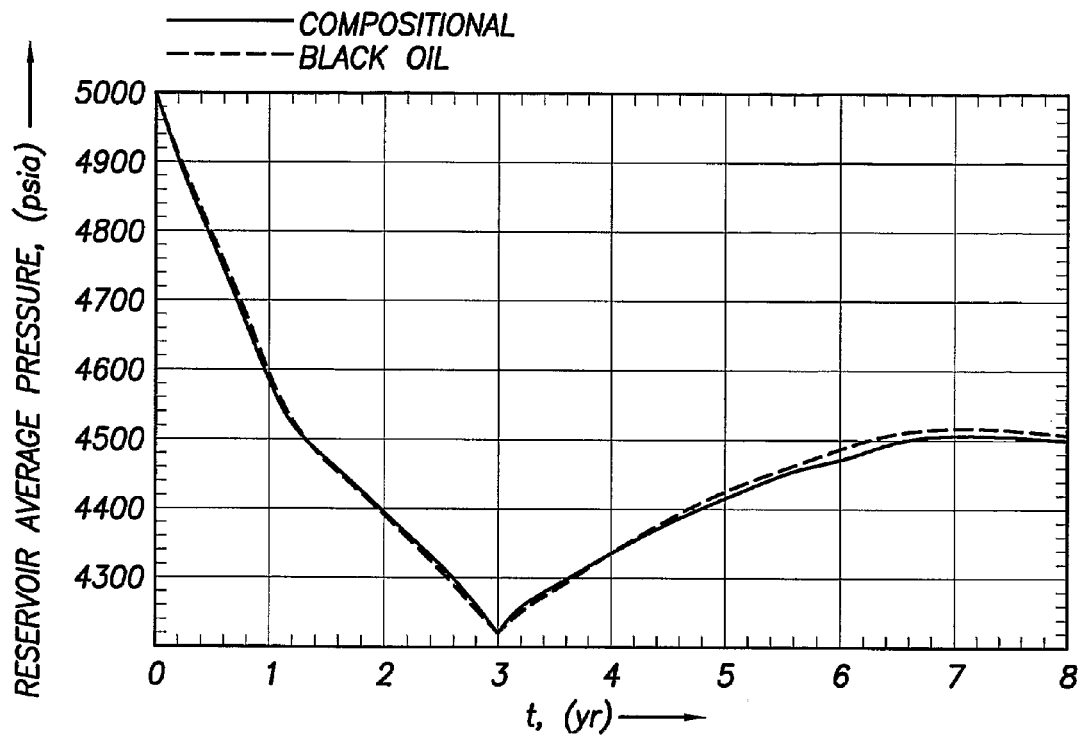
Figure 8A:
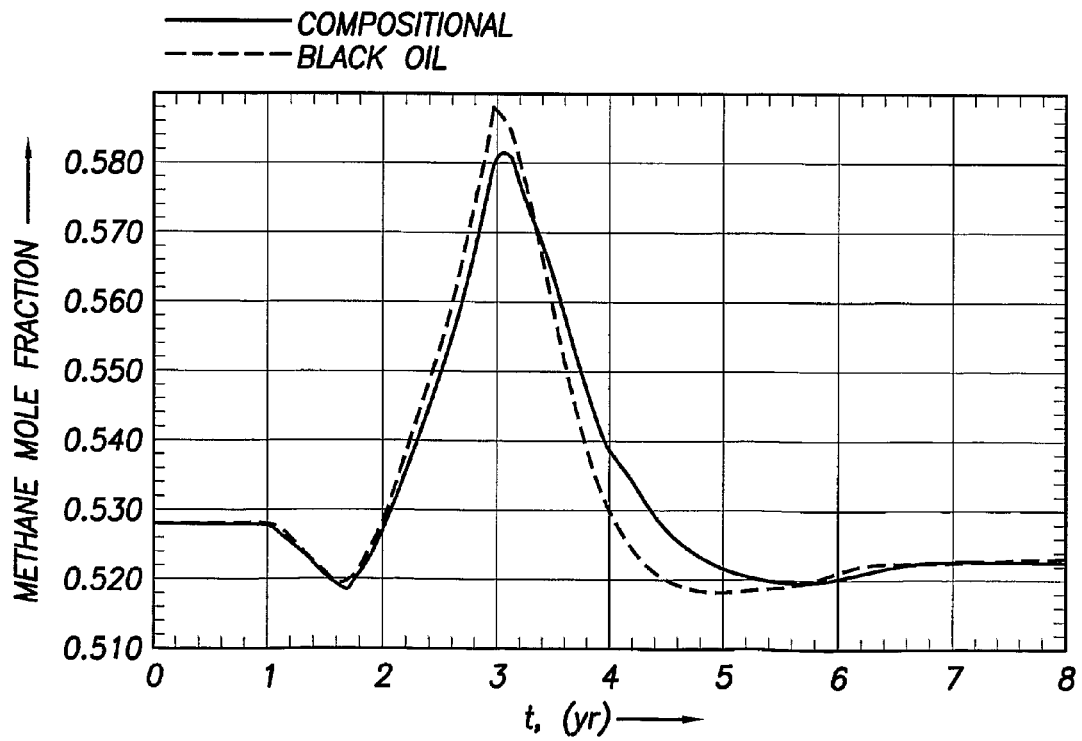
Figure 8B:
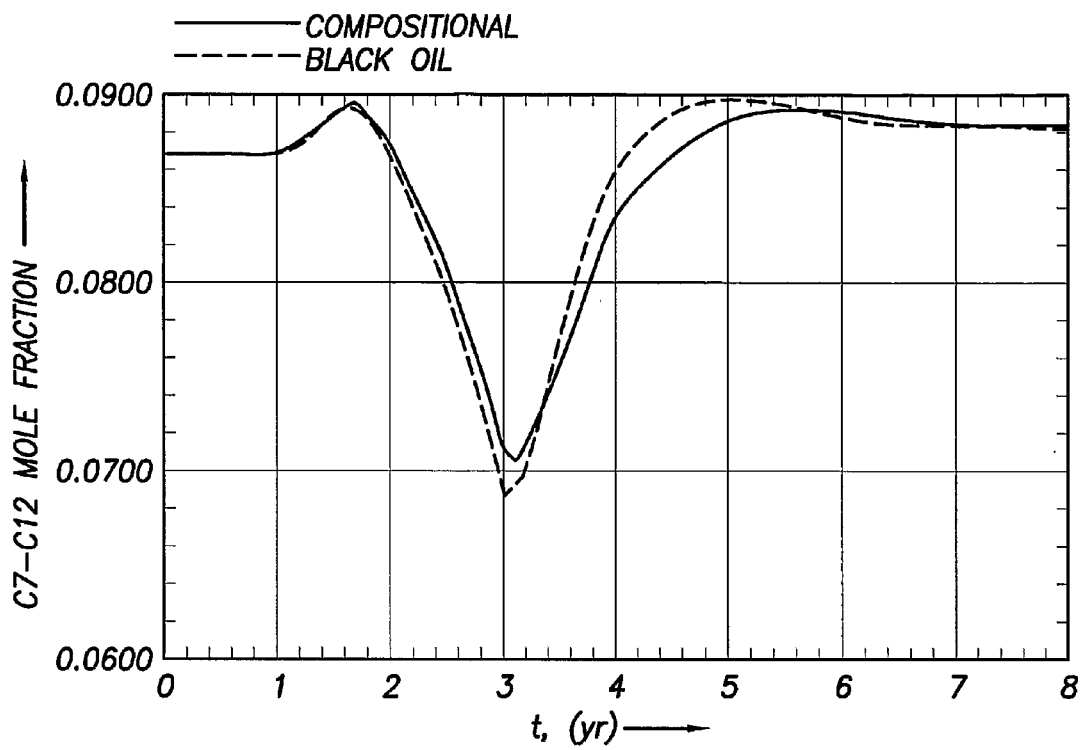

Refer to FIG. 7(b) and FIG. 8.

FIG. 7(b) shows the gas production over a period of 8 years. There is an excellent match between the compositional model and the delumped black oil model.

FIG. 8 shows the methane composition (a) and the composition of the pseudo-components $C_7$-$C_{12}$ (b) vs. time. As with the gas production rate, composition of the delumped black oil wellstream is in very good agreement with the wellstream from the compositional model.

Example 2

Multiple Fluid Regions

This example illustrates the accuracy of the delumping scheme in the case of reservoirs with multiple fluid regions.

Referring to Table 1 set forth below, in the compositional model, fluids 1, 2 and 3 (shown in Table 1) are used to initialize the bottom, middle and top layers of the reservoir respectively. Note that the methane content decreases with depth while the heavy components' and pseudo-components' mole fractions increase with depth. The initial reservoir pressure is 5000 psi, which is slightly higher than the bubblepoint pressure of the liquid in the top of the reservoir.

The equivalent black oil model has three PVT regions corresponding to the fluid regions in the equivalent compositional models.

Figure 9A:
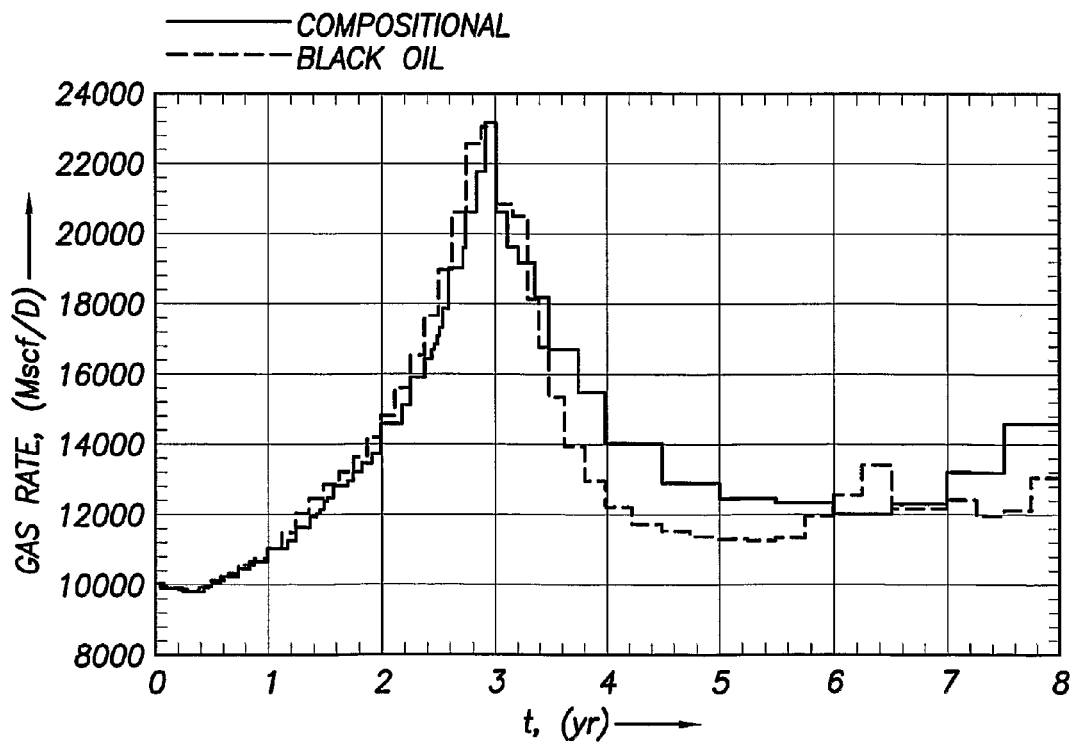
FIGS. 9a and 9b illustrates example 2.

Referring to FIGS. 7(a) and 9(a), referring initially to FIG. 9(a), the black oil model is in agreement with the compositional model in terms of gas rate vs. production time. Agreement between the compositional model and the equivalent black oil model in the example, however, is not as good as that observed in Example I, with reference to FIG. 7(a). We did not refine the black oil model to obtain a better agreement.

Black oil delumping takes place at the completion level in this example. Consequently, three different sets of tables are used to delump the black oil stream from well completions belonging to the three different layers of the reservoir. The composition of the delumped wellstream is then calculated as described in the Formulation section.

Figure 9B:
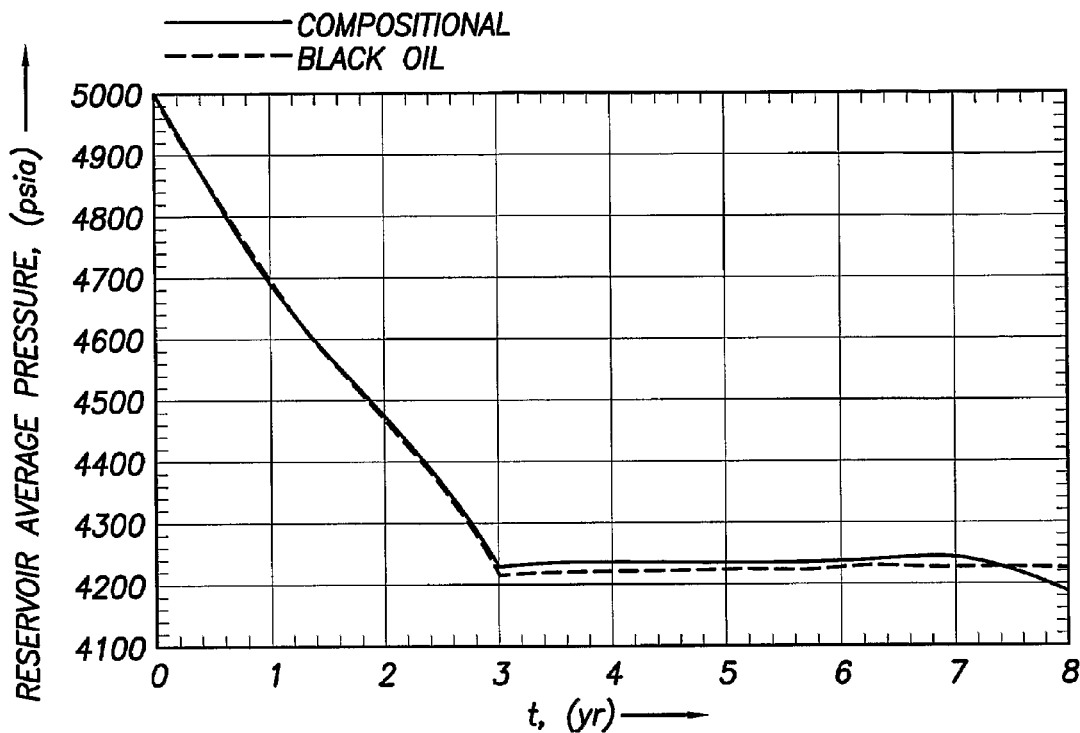
Figure 10A:
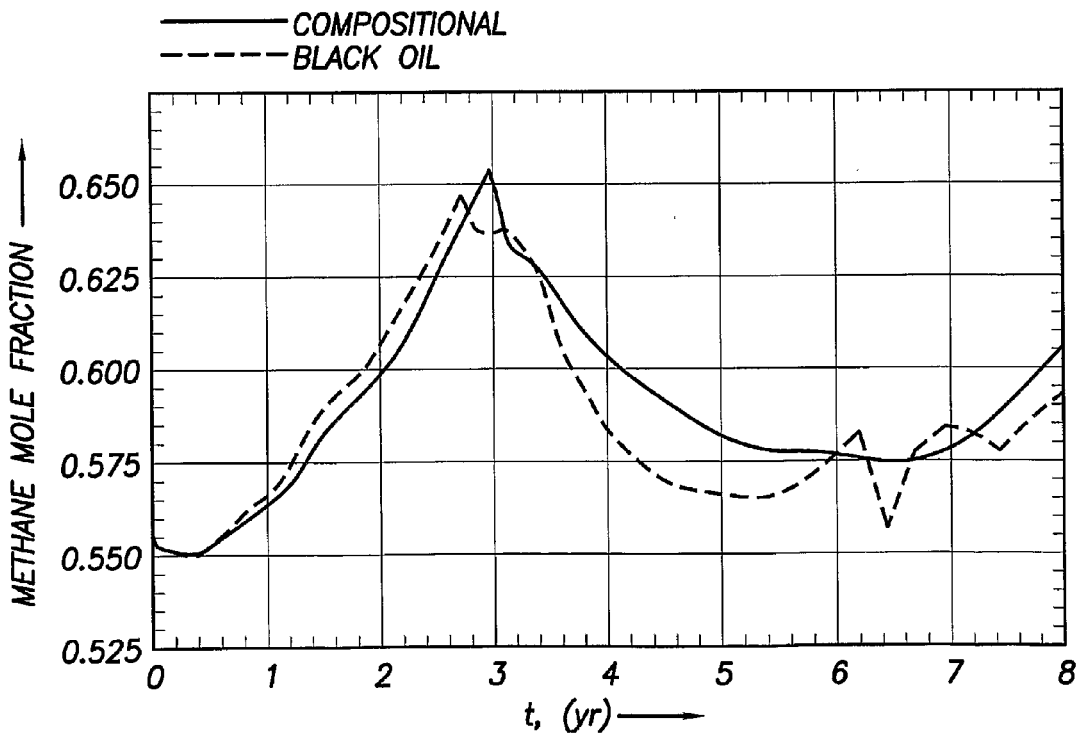
FIGS. 10a and 10b illustrates example 2, delumped composition.
Figure 10B:
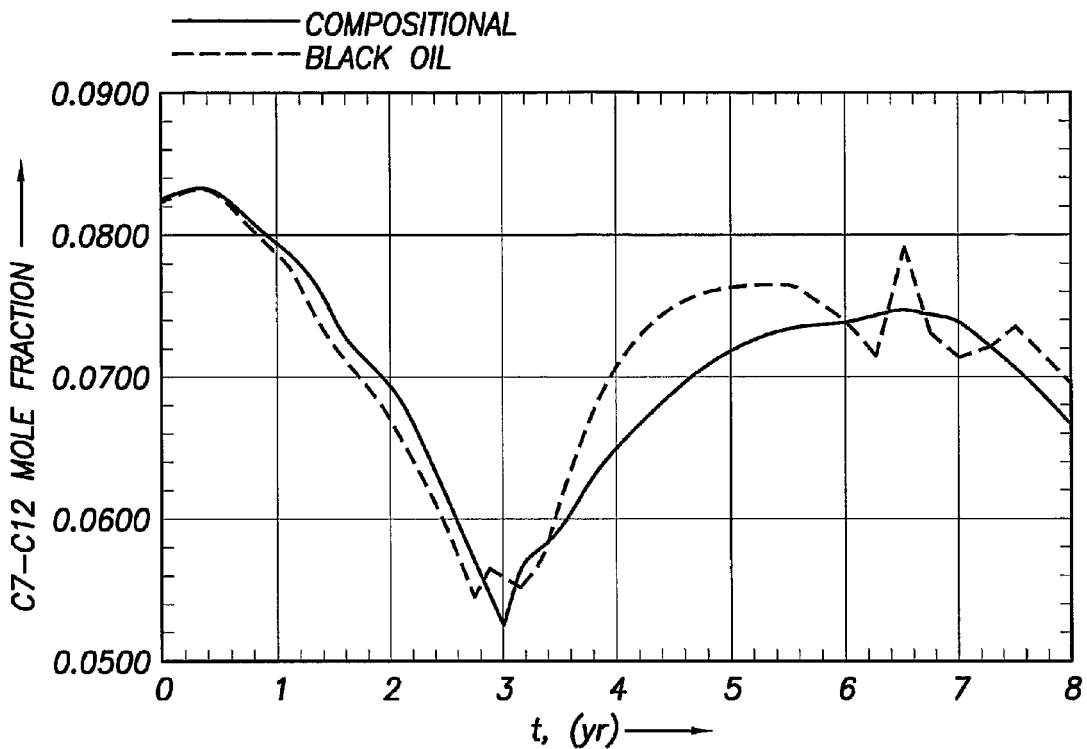
Figure 12A:
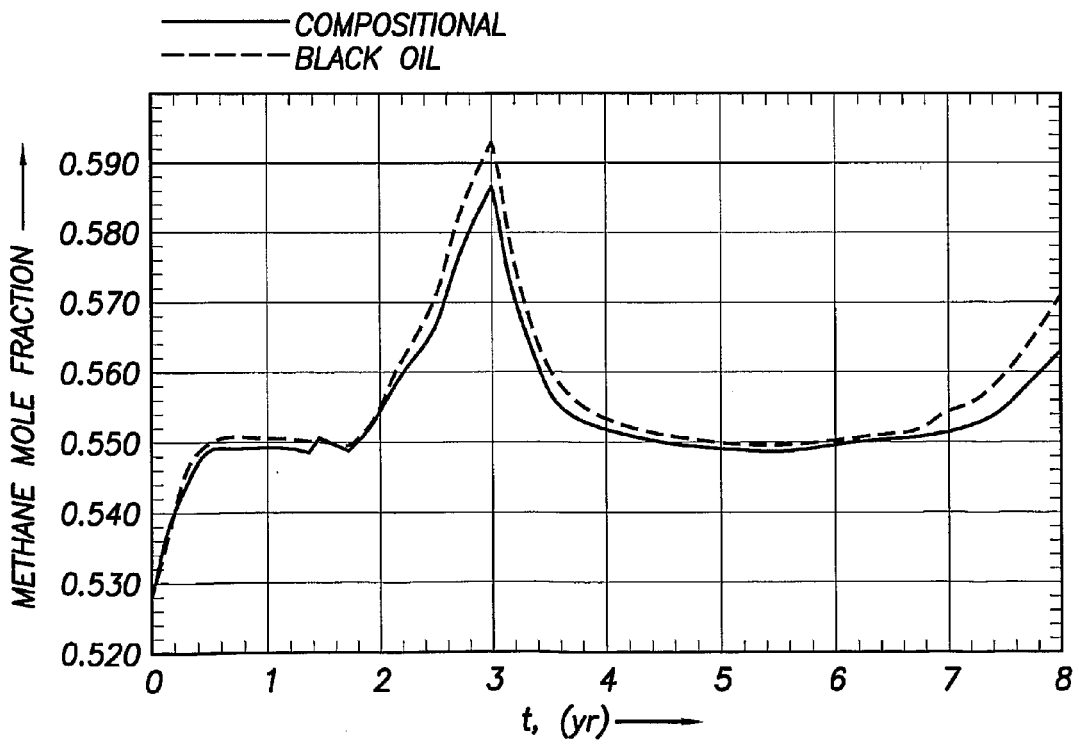
FIGS. 12a and 12b illustrates example 3, delumped composition.
Figure 12B:
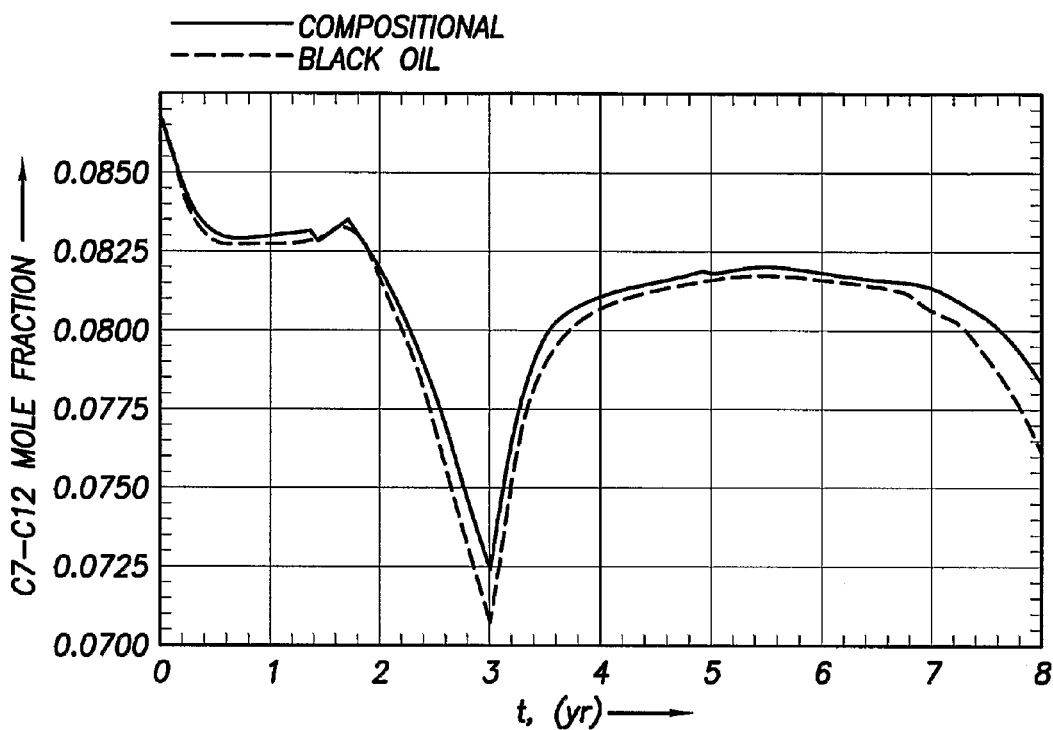

Referring to FIG. 9(b), a natural depletion process is applied during the first 3 years. A 100% voidage replacement water injection scheme is applied for the remaining production time (5 years). The average reservoir pressure decreases to around 4000 psi at the end of the third year and increases back to around 4250 psi at the end of the eighth year as shown in FIG. 9(b).

Figure 10:
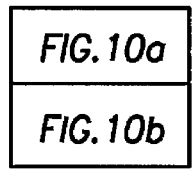
FIG. 10 including

Referring to FIG. 10, the methane composition and the $C_7$-$C_{12}$ pseudo-component composition vs. time depicted in FIG. 10 shows a good match between the compositional model and the delumped black oil model.

Example 3

Well with Crossflow

This example is similar to Example 1, with one major difference: the three layers of the reservoir are initialized with different pressures, causing the wells to crossflow. A natural depletion process is applied during the first three years. A 100% voidage replacement water injection scheme is applied for the remaining production time (5 years).

The initial pressures of the three layers are as follow: 5500 psi (top), 4800 psi (middle), and 6500 psi (bottom). The three layers use, however, the same PVT model: that of Fluid 1 (see FIG. 6). Initial pressure in these three layers is higher than the bubblepoint pressures, which are 4958 psi (top), 4722 psi (middle) and 4522 psi (bottom).

Figure 11:
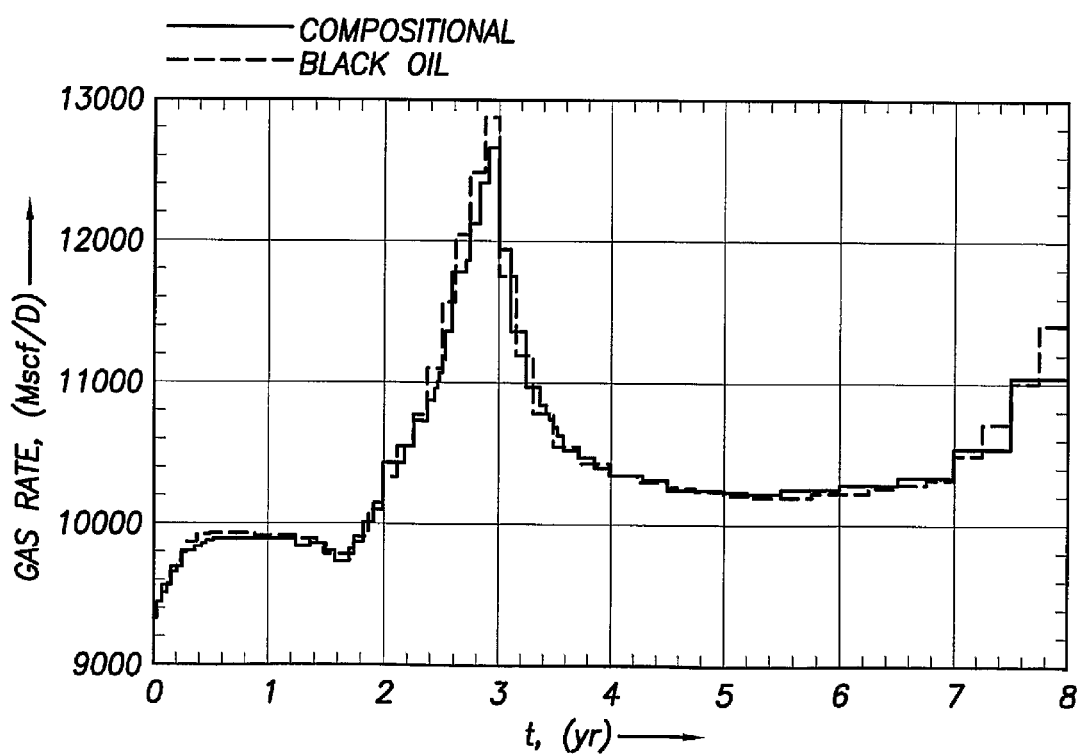
FIG. 11 illustrates example 3, field gas production vs time.

Referring to FIG. 11, FIG. 11 depicts the gas rate vs. time from both the compositional model and its equivalent black oil model. Results from these figures show a very good match between the two models.

Figure 12:
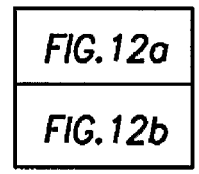
FIG. 12 including

Referring to FIG. 12, composition vs. time from the two models is presented in FIG. 12.

Figure 14:
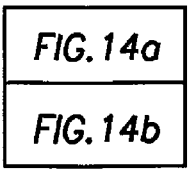
FIG. 14 including
Figure 13:
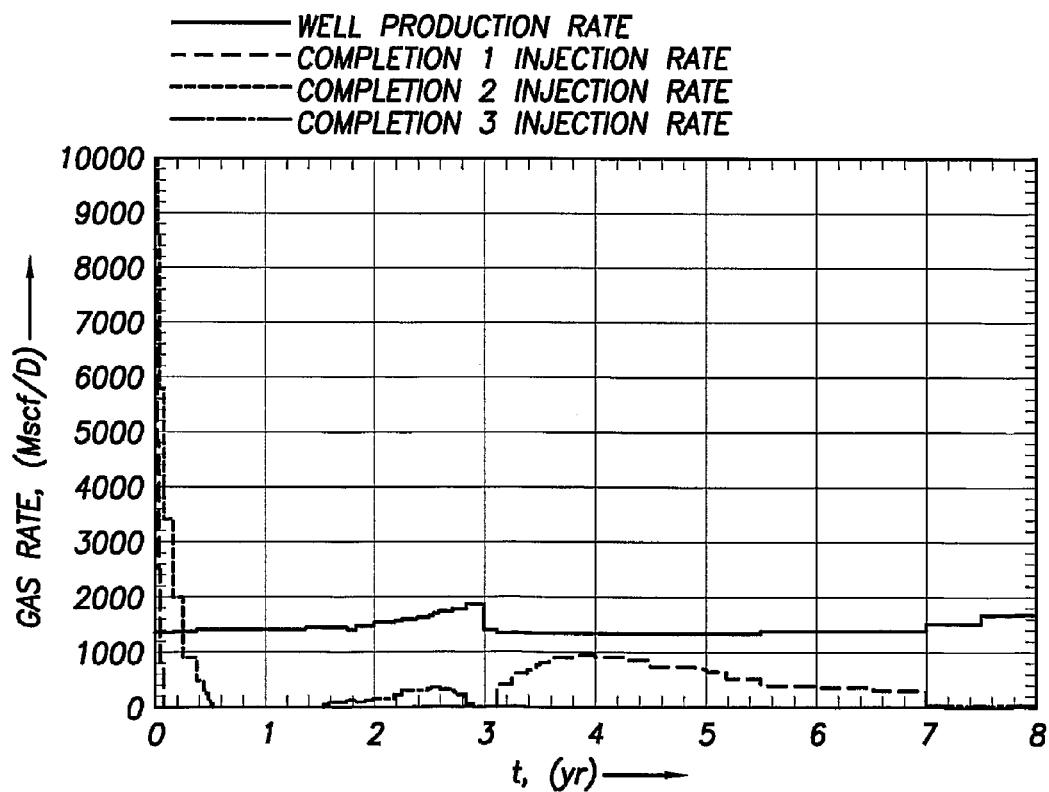
FIG. 13 illustrates example 3, gas production rate vs time for well PA4 and gas injection rate of the three completions of well PA4.
Figure 14A:
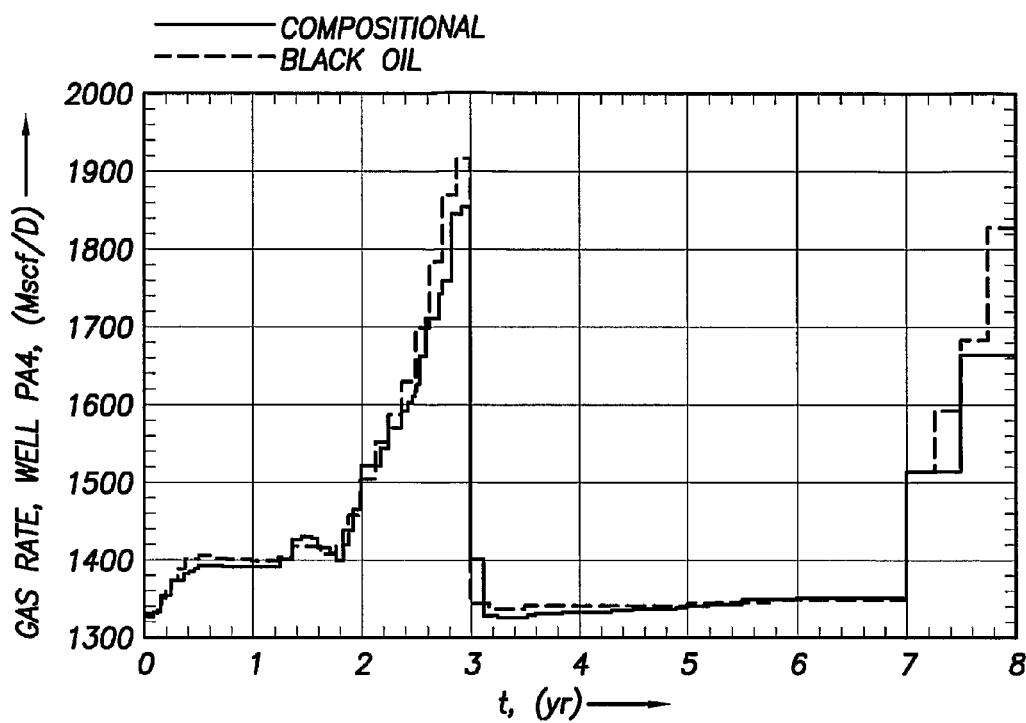
FIGS. 14a and 14b illustrates example 3, well PA4.
Figure 14B:
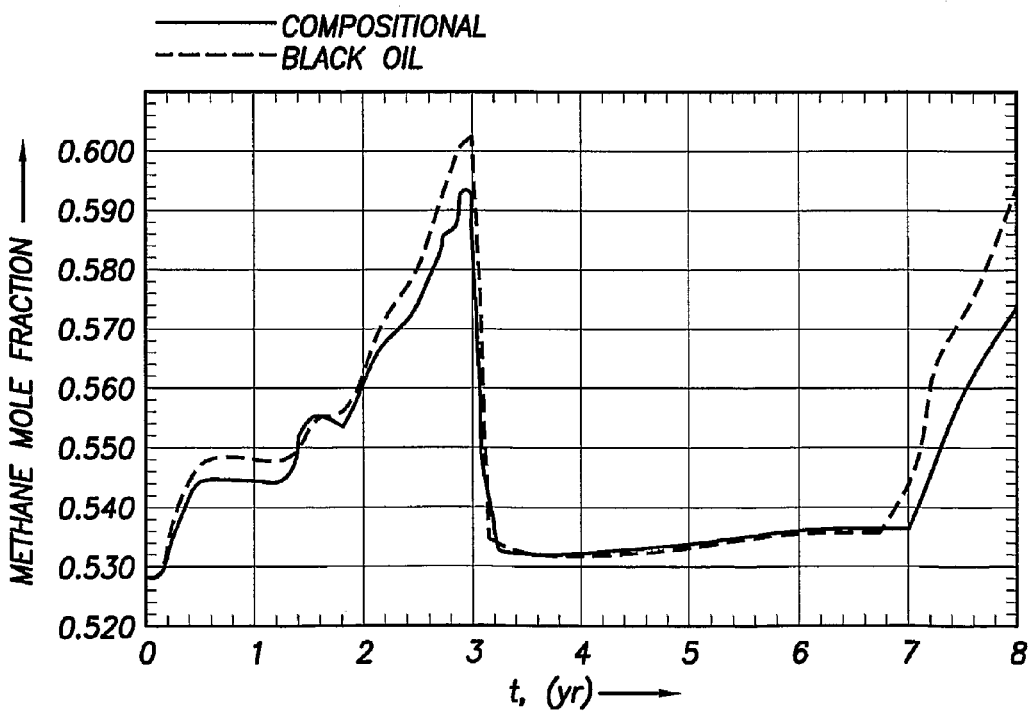
Figure 15A:
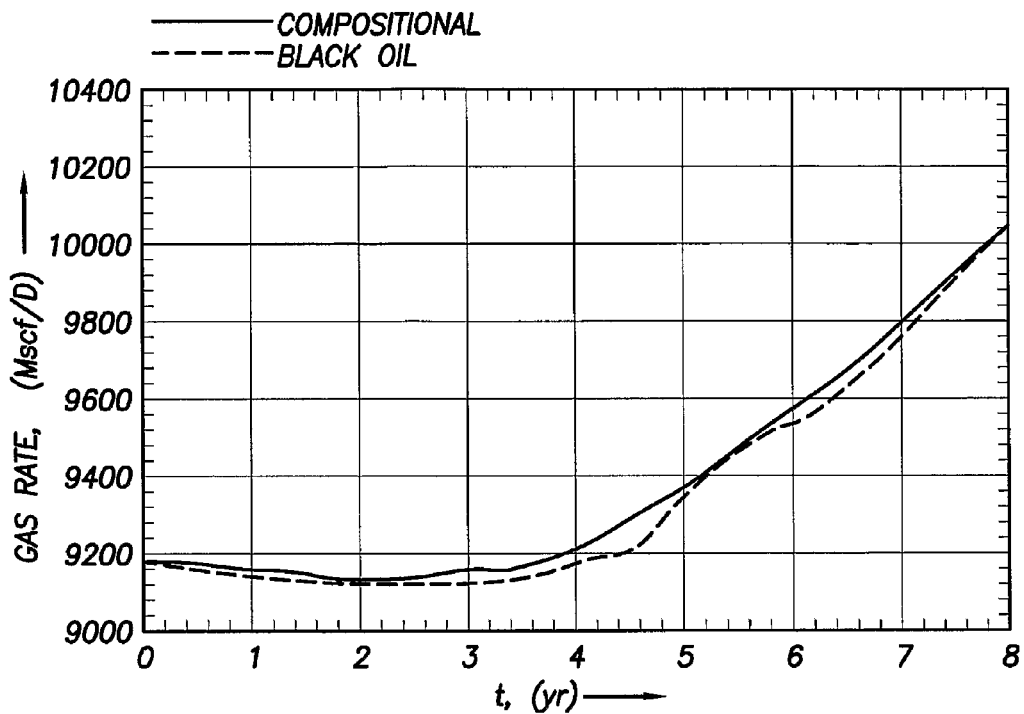
Figure 15B:
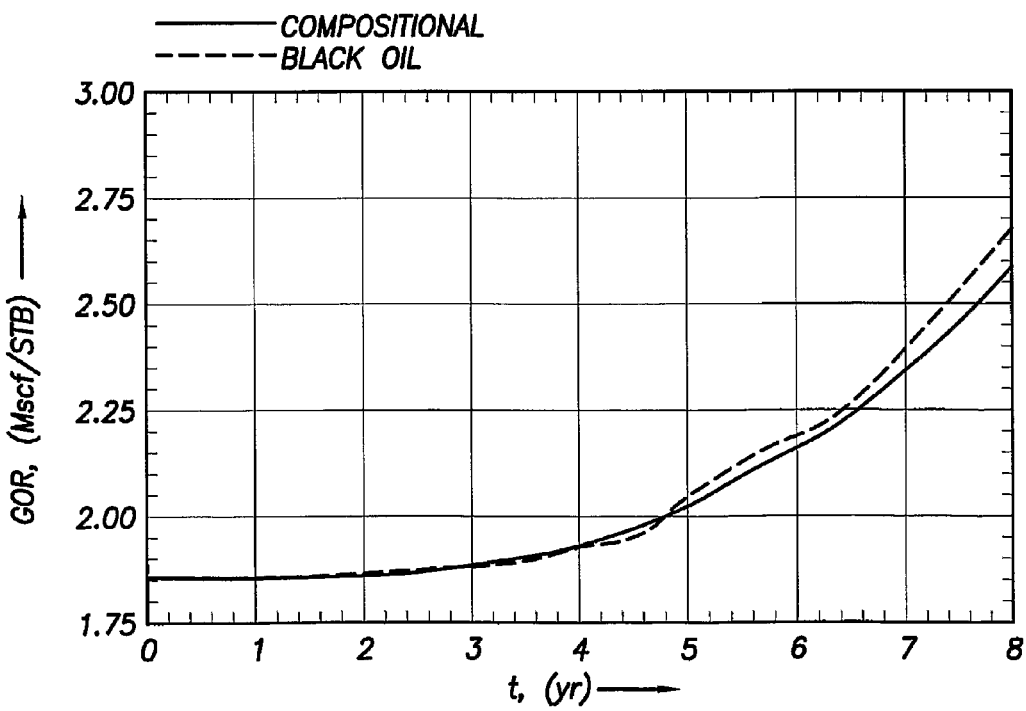
Figure 15C:
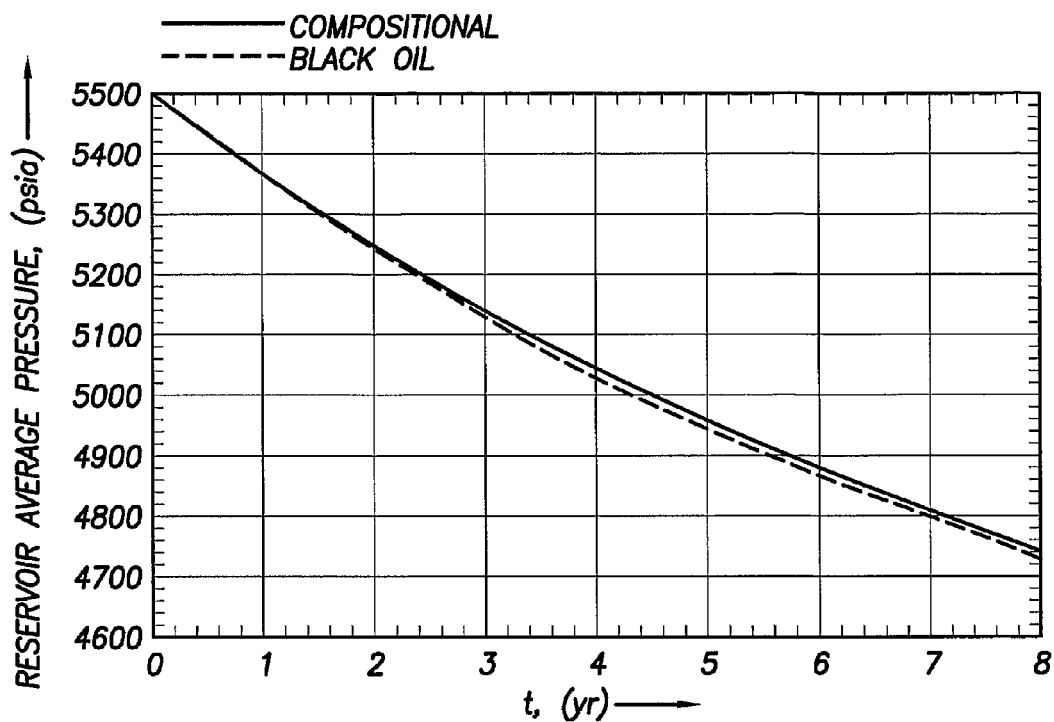
Figure 16A:
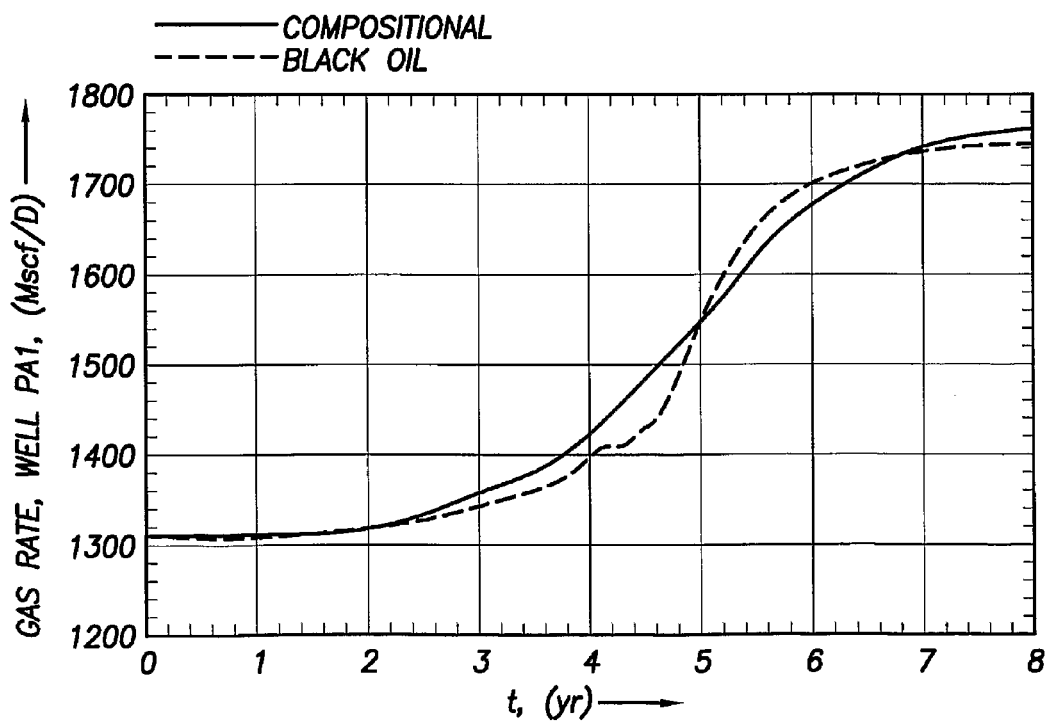
Figure 16B:
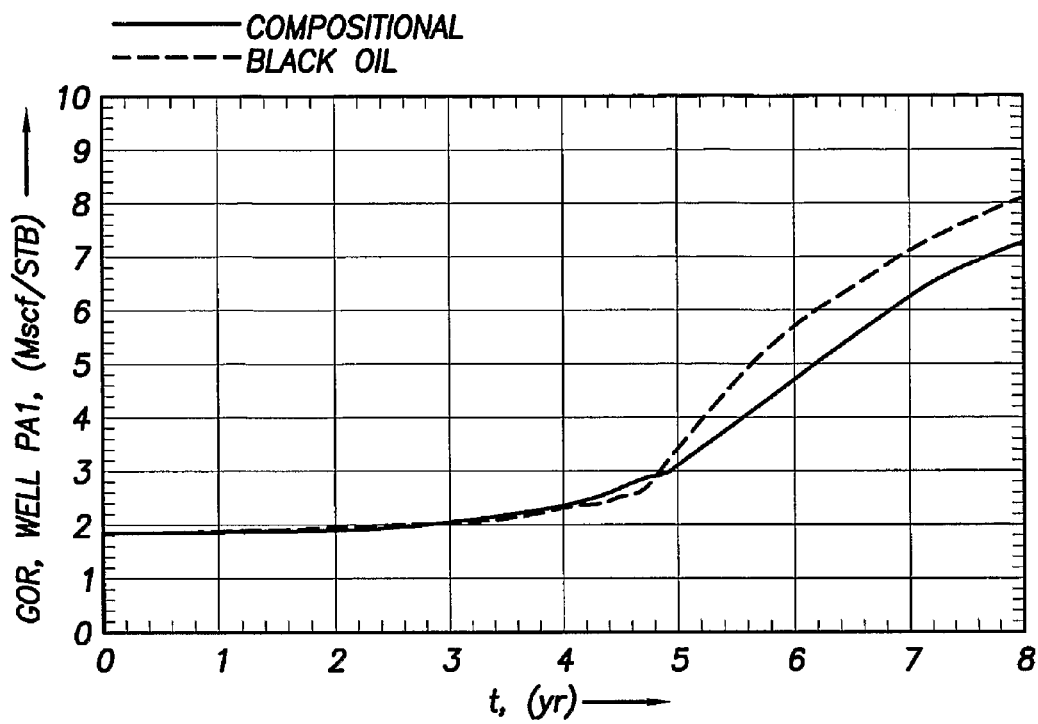

Referring to FIGS. 13 and 14, referring initially to FIG. 13, crossflow takes place mainly during the few first months of production and later during the water-injection phase. FIG. 13 shows the gas production rate from one producer and the gas injection rate due to crossflow of the well's three completions. Completion 3 in the figure corresponds to the bottom layer. Because of the higher initial pressure in this layer, completion 3 is the only one that produces in the first few months while the completions belonging to the low-pressure layers inject due to crossflow. Gas production rate vs. time and methane mole fraction vs. time for well PA4 from both the compositional model and its equivalent black oil model are presented in FIG. 14, which shows a very good match in terms of the delumped black oil stream despite the substantial crossflow that takes place.

Example 4

Gas Injection

The aim of this example is to discuss issues related to black oil delumping in the presence of gas injection.

The reservoir initial composition corresponding to this example is that of Fluid 1 (see Table 1). Initial pressure in the reservoir is 5500 psi, and the entire reservoir is initially in the liquid phase (undersaturated).

No water injection takes place in this example. An 80% voidage replacement gas-injection scheme is applied from the beginning of the production process. Field production is limited to 10000 RB/D. This rate is apportioned equally among producers (when possible). Unlike the three examples above, no economic limits are applied.

Figure 15:
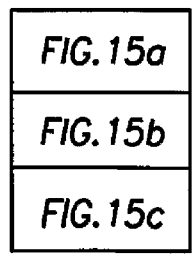
FIGS. 15 and 16 illustrate example 4.
Figure 16:
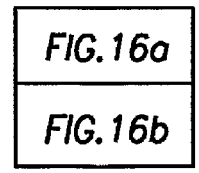
Figure 6A:
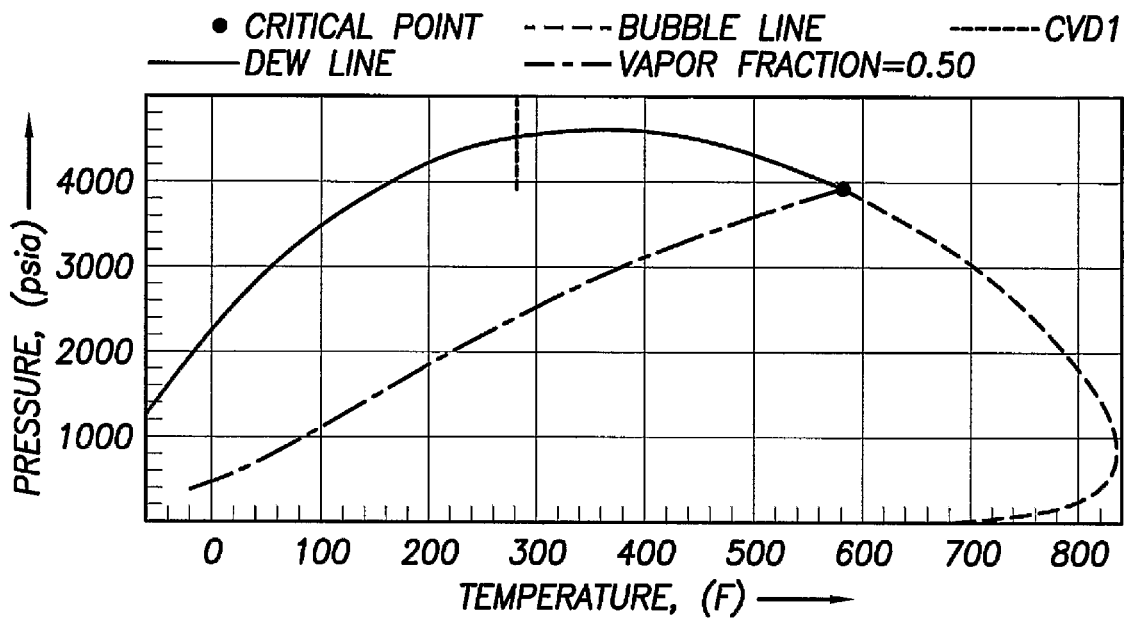
Figure 6B:
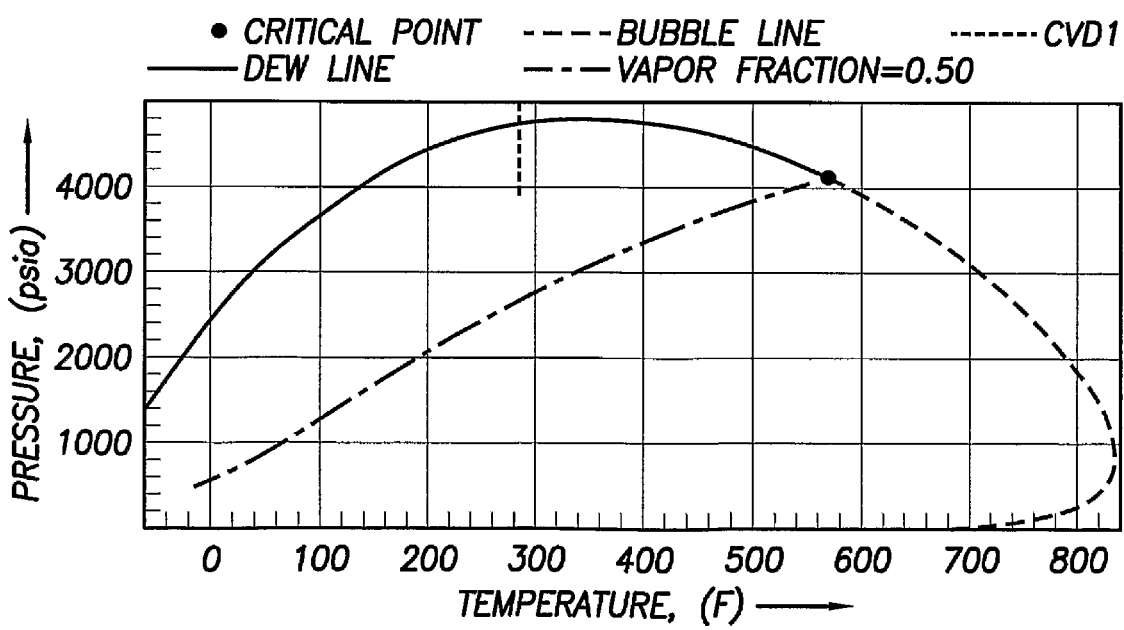
Figure 6C:
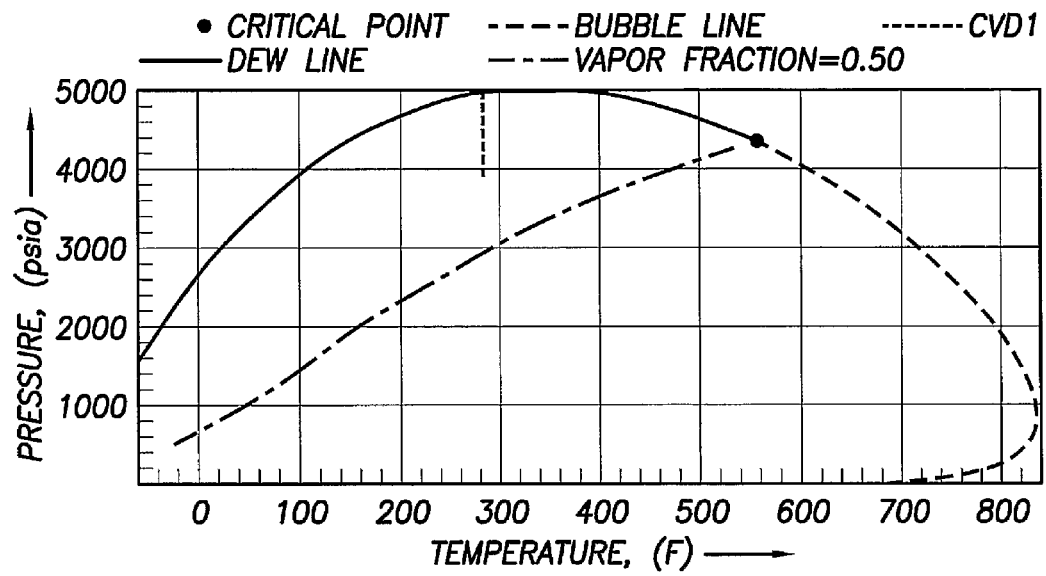
Figure 17:
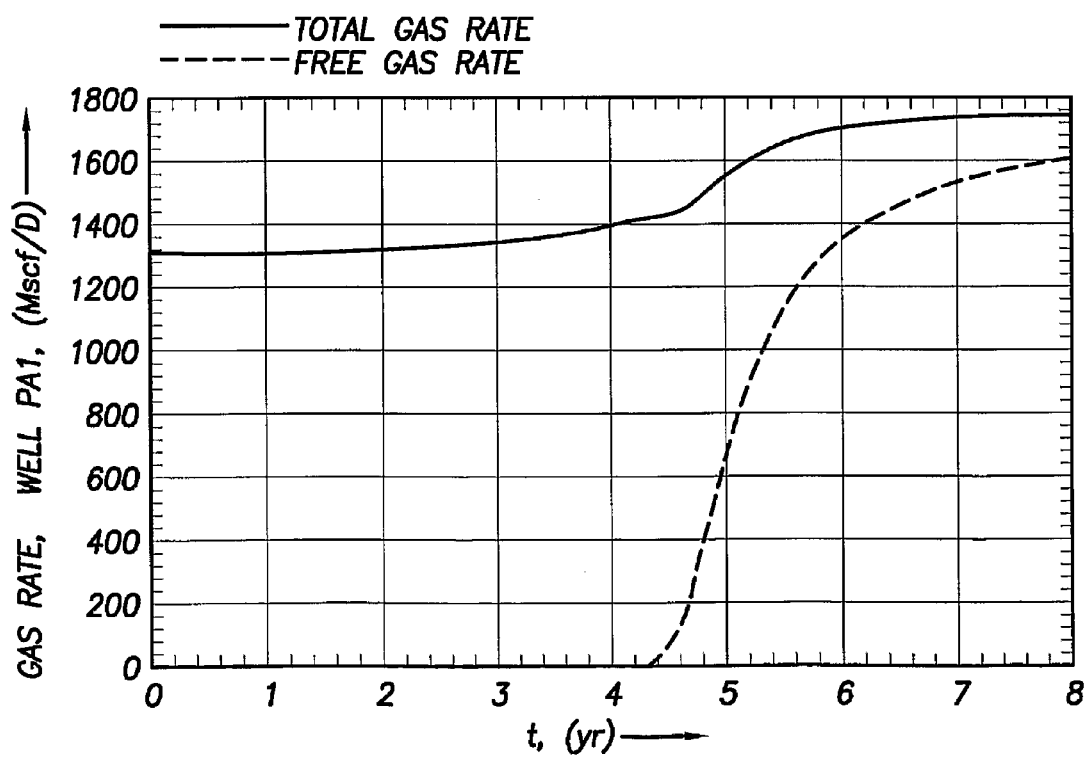
FIG. 17 illustrates example 4, total and free gas production rates vs time, well PA1.

Referring to FIGS. 15, 16, and 17, FIG. 15 shows the field gas rate, the field GOR and the reservoir average pressure from the compositional model as well as its equivalent black oil model. Since most of the reservoir is mainly in the undersaturated region during production, a good match is obtained between these two models. FIG. 16 shows the gas rate and the GOR for Well PA1 from both models. PA1 is the first well experiencing gas breakthrough, which occurs in the fifth production year, as shown in FIG. 17, which depicts both total gas production rate and free gas production rate. As seen from these figures, a better match is obtained in terms of GOR before breakthrough takes place.

Black oil delumping in this example is performed using tabulated liquid and vapour composition vs. $R_S$. Appendix B details the process through which these tables are obtained. Delumping takes place at the well completion level.

Figure 18:
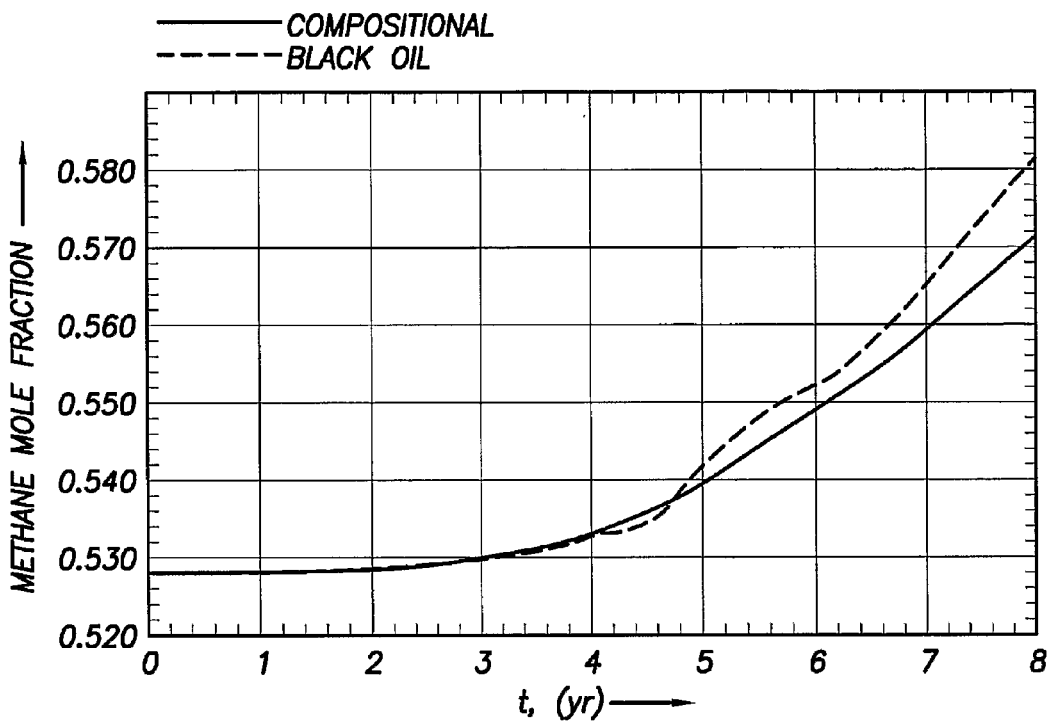
FIG. 18 illustrates example 4, field methane mole fraction vs time.
Figure 19:
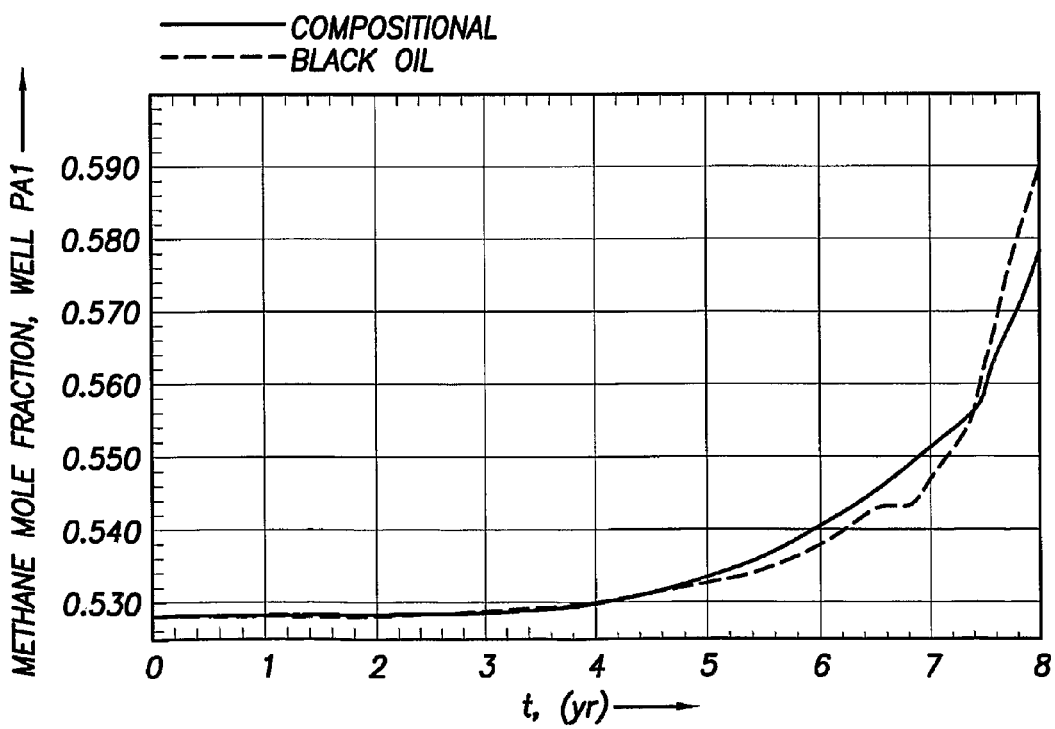
FIG. 19 illustrates example 4, well PA1 methane mole fraction vs time.

Referring to FIGS. 18 and 19, these figures (18 and 19) present the methane mole fraction vs. time from both the compositional model and its equivalent black oil model. An excellent match is obtained in the production period prior to gas breakthrough. The delumped compositional stream matches less accurately after gas breakthrough; however, the results are acceptable. Note that this match is obtained even though the table of vapor composition vs. $R_S$ assumes that the entire gas cap is in equilibrium with the liquid phase.

A general conclusion can be drawn from the above examples: the level of agreement between black oil model and its equivalent compositional model, in terms of composition (component molar rates or mole fractions) vs. production time, is proportional to the agreement between the two models in terms of gas (or oil) production vs. time. The higher the quality of the black oil model (compared with the compositional model), the better the agreement between the two models in terms of composition vs. time.

The delumping method presented in this specification uses tables of liquid and vapor composition vs. saturation pressure, which are typically obtained from a depletion process. This method allows us to retrieve the most detailed compositional information possible in a black oil delumping process, provided that the saturation pressure intervals in these tables are the same as those in the black oil PVT tables (obtained, basically, using the same depletion simulation). Having finer pressure intervals than those in the black oil PVT tables does not necessarily result in a better compositional fluid description.

More investigation is needed in the case of production processes involving gas injection in the saturated region. It should be mentioned that black oil modeling might, basically, fail to simulate the process accurately in such configurations.

Nomenclature

| | |
|---|---|
| $B^o =$ | oil formation factor, $L^3/L^3$, RB/STB |
| CCD = | constant-composition depletion |
| CVD = | constant-volume depletion |
| DE = | differential liberation |
| GOR = | gas/oil ratio $L^3/L^3$, Mscf/STB |
| $H_w =$ | well bore pressure head, $m/Lt^2$, psi |
| m = | Mass. m, lbm |
| M = | molar weight, m, lbm/mole |
| $M^f =$ | phase mobility |
| n = | number of moles |
| PVT = | pressure/volume/temperature |
| p = | pressure, $m/Lt^2$, psi |
| $p_w =$ | bottom hole pressure, $m/Lt^2$, psi |
| q = | surface volumetric rate |
| $q^g =$ | gas surface volumetric rate, $m^3/t$, Mscf/D |
| $q^o =$ | oil surface volumetric rate, $m^3/t$, STB/D |
| Q = | mass rate, m/t, lbm/D |
| $R_s =$ | liquid phase gas/oil ratio, $L^3/L^3$, Mscf/STB |
| $R_v =$ | vapor phase oil/gas ratio, $L^3/L^3$, STB/Mscf |
| $T_w =$ | transmissibility factor |
| t = | time, t, yr |
| x = | liquid composition (component mole fractions) |
| y = | vapor composition (component mole fractions) |
| z = | total composition (component mole fractions) |
| $\rho^g =$ | surface gas density, $m/L^3$, lbm/Mscf |
| $\rho^o =$ | surface oil density, $m/L^3$, lbm/STB |

Subscripts

| | |
|---|---|
| 0 = | initial state |
| a = | adjusted |

-continued

| | |
|---|---|
| bub = | bubble point |
| I = | injection |
| i = | components |
| j = | well-connection |
| k = | well-completion |
| m = | mass |
| P = | production |
| s = | surface |
| v = | volume |

Superscripts

| | |
|---|---|
| f = | phase |
| g = | gas |
| L = | liquid |
| o = | oil |
| V = | vapor |

'REFERENCES' WHICH ARE INCORPORATED BY REFERENCE INTO THIS SPECIFICATION

1. Weisenborn, A. J., and Schulte, A. M.: "Compositional Integrated Sub-Surface-Surface Modeling," paper SPE 65158 presented at the SPE European Petroleum Conference, Paris, France (Oct. 24-25, 2000).
2. Ghorayeb, K. et al.: "A General Purpose Controller for Coupling Multiple Reservoir Simulations and Surface Facility Networks," paper SPE 79702 presented at the 2003 SPE Reservoir Simulation Symposium, Houston, Tex., USA (Feb. 3-5, 2003).
3. Ghorayeb, K., Holmes, J. A., and Torrens R.: "Field Planning Using Integrated Surface/Subsurface Modeling," paper SPE 92381 presented at the 14$^{th}$ SPE Middle East Oil & Gas Show and Conference, Bahrain (Mar. 12-15, 2005).
4. Barroux, C. C. et al.: "Linking Reservoir and Surface Simulators: How to Improve the Coupled Solutions," paper SPE 65159 presented at the SPE European Petroleum Conference, Paris, France (Oct. 24-25, 2000).

APPENDIX A—WELL AVERAGE PRESSURE

In the following we summarize the well's average pressure (grid-block equivalent pressure[4]) calculation.

The inflow performance relationship can be written in terms of the volumetric production rate of each phase at stock tank conditions as:

$$q_j^f = T_{wj} M_j^f (p_j - p_w - H_{wj}) \quad (25)$$

where:
$q_j^f$ is the volumetric flow rate of phase f in connection j at stock-tank conditions. The flow is taken as positive from the formation into the well, and negative from the well into the formation,
$T_{wj}$ is the connection transmissibility factor,
$M_j^f$ is the phase mobility at the connection,
$p_j$ is the pressure in the grid block containing the connection,
$p_w$ is the bottom hole pressure of the well, and
$H_{wj}$ is the well bore pressure head between the connection and the well's bottom hole datum depth.
By summing up over all the well's $N_g$ grid cells one obtains:

$$\sum_{j=1}^{N_g} q_j^f = \sum_{j=1}^{N_g} T_{wj} M_j^f p_j - p_w \sum_{j=1}^{N_g} T_{wj} M_j^f - \sum_{j=1}^{N_g} T_{wj} M_j^f H_{wj} \quad (26)$$

The well's averaged pressure $p^a$ is defined by:

$$p^a = \sum_{j=1}^{N_g} T_{wj} M_j^f p_j \bigg/ \sum_{j=1}^{N_g} T_{wj} M_j^f \quad (27)$$

The phase with highest mass rate is selected in Eq. 27.

APPENDIX B—LOOK-UP TABLES FOR EXAMPLE 4

Black oil delumping tables for Examples 1, 2 and 3 were automatically generated by the software package used for simulating the black oil model depletion process (CVD). This is not the case for the tables used for black oil delumping in Example 4 (involving gas injection).

In Example 4, a swelling-test experiment simulation is performed to investigate the effect of the injected gas on the fluid behavior. This consists of adding prescribed volumes of gas at given $GOR_I$ (volume of injection gas at standard conditions per volume of original reservoir fluid at its saturation pressure). Among other information, the experiment provides tabulated liquid composition vs. $GOR_I$. The experiment also provides tables of vapor composition (in equilibrium with the liquid) vs. $GOR_I$.

Let $R_{S0}$ denote the gas-oil ratio of the initial mixture (corresponding to zero injected gas). The liquid gas-oil ratio that corresponds to a given added volume of gas can be approximated by the following:

$$R_s = \frac{V_0^{gL} + V^{gI}}{V_0^{oL}}, \quad (28)$$

where $V_0^{gL}$ and $V_0^{oL}$ denote the gas and oil volumes resulting from flashing a volume of liquid (with no injected gas) at surface conditions; $V^{gI}$ is the surface volume of the injected gas.

In Eq. 28, the following is assumed:
The total surface gas volume equals the sum of the injected surface gas volume and the liquid phase surface gas volume.
The injected gas does not affect the surface oil volume from the liquid phase.
Eq. 28 implies:

$$R_S = R_{S0} + GOR_I \times B^o, \quad (29)$$

where $B^o$ is the oil formation volume factor (of the order of 2.1 Rb/STB in Example 4).

Tabulated liquid and vapor composition vs. $R_S$ are thus used in the black oil delumping for Example 4.

| SI Metric Conversion Factors | |
|---|---|
| ° F. | (° F. + 459.67)/1.8 = K |
| Mscf × 3.048* | E+02 = m$^3$ |
| STB × 1.589 873 | E−01 = m$^3$ |
| psi × 6.894 757 | E+00 = pa |

*Conversion factor is exact

TABLE 1

Component mole fractions for the three fluids used in the examples.

| Pseudo-component | Component | | |
|---|---|---|---|
| | Fluid 1 | Fluid 2 | Fluid 3 |
| $N_2$ | 0.0069 | 0.0066 | 0.0062 |
| $CO_2$ | 0.0314 | 0.0300 | 0.0285 |
| $C_1$ | 0.528 | 0.5480 | 0.5709 |
| $C_2$-$C_3$ | 0.1515 | 0.1450 | 0.1377 |
| $C_4$-$C_6$ | 0.0703 | 0.0673 | 0.0639 |
| $C_7$-$C_{12}$ | 0.0867 | 0.0830 | 0.0788 |
| $C_{13}$-$C_{18}$ | 0.0529 | 0.0506 | 0.0480 |
| $C_{19}$-$C_{25}$ | 0.034 | 0.0325 | 0.0309 |
| $C_{26}$-$C_{42}$ | 0.0238 | 0.0227 | 0.0216 |
| $C_{43+}$ | 0.0145 | 0.0138 | 0.0131 |
| $P_{bub}$ at 284° F. | 4522 psi | 4722 psi | 4958 psi |
| $R_S$ at $P_{bub}$ at 284° F. | 1.86 Mscf/STB | 1.97 Mscf/STB | 2.12 Mscf/STB |

The above description of the 'Black Oil Delumping' method being thus described, it will be obvious that the same may be varied in many ways. Such variations are not to be regarded as a departure from the spirit and scope of the claimed method or apparatus or program storage device, and all such modifications as would be obvious to one skilled in the art are intended to be included within the scope of the following claims.

We claim:

1. A method for evaluating a production well using black oil delumping, comprising:
    obtaining a vapor composition versus pressure table and a liquid composition versus pressure table;
    converting, using a simulator executing on a processor, a black oil wellstream into a compositional wellstream comprising a vapor component and a liquid component by:
        obtaining a first average saturation pressure weighted by liquid mass inflow rate from the production well;
        performing a first query in the liquid composition versus pressure table with the first average saturation pressure to obtain a corresponding liquid composition;
        calculating a liquid molar weight using the corresponding liquid composition;
        obtaining a second average saturation pressure weighted by vapor mass inflow rate from the production well;
        performing a second query in the vapor composition versus pressure table with the second average saturation pressure to obtain a corresponding vapor composition;
        calculating a vapor molar weight using the corresponding vapor composition;
        calculating a vapor fraction using the liquid molar weight and the vapor molar weight; and
        calculating a compositional wellstream for the production well using the vapor fraction; and
    evaluating the production well using the compositional wellstream.

2. The method of claim 1, wherein converting the black oil wellstream into the compositional wellstream occurs during completion of the production well.

3. The method of claim 1, wherein converting the black oil wellstream into the compositional wellstream occurs during depletion of the production well.

4. The method of claim 1, wherein the black oil wellstream is in liquid phase.

5. A non-transitory program storage device comprising computer readable program code embodied therein for performing a method for evaluating a production well using black oil delumping, the method comprising:
    obtaining a vapor composition versus pressure table and a liquid composition versus pressure table;
    converting, using a simulator, a black oil wellstream into a compositional wellstream comprising a vapor component and a liquid component by:
        obtaining a first average saturation pressure weighted by liquid mass inflow rate from the production well;
        performing a first query in the liquid composition versus pressure table with the first average saturation pressure to obtain a corresponding liquid composition;
        calculating a liquid molar weight using the corresponding liquid composition;
        obtaining a second average saturation pressure weighted by vapor mass inflow rate from the production well;
        performing a second query in the vapor composition versus pressure table with the second average saturation pressure to obtain a corresponding vapor composition;
        calculating a vapor molar weight using the corresponding vapor composition;
        calculating a vapor fraction using the liquid molar weight and the vapor molar weight; and
        calculating a compositional wellstream for the production well using the vapor fraction; and
    evaluating the production well using the compositional wellstream.

6. A system for evaluating a production well using black oil delumping, comprising:
    a processor; and
    a controller executing on the processor, wherein the controller is configured to:
        obtain a vapor composition versus pressure table and a liquid composition versus pressure table;
        convert a black oil wellstream into a compositional wellstream comprising a vapor component and a liquid component by:
            obtaining a first average saturation pressure weighted by liquid mass inflow rate from the production well;
            performing a first query in the liquid composition versus pressure table with the first average saturation pressure to obtain a corresponding liquid composition;
            calculating a liquid molar weight using the corresponding liquid composition;
            obtaining a second average saturation pressure weighted by vapor mass inflow rate from the production well;
            performing a second query in the vapor composition versus pressure table with the second average saturation pressure to obtain a corresponding vapor composition;
            calculating a vapor molar weight using the corresponding vapor composition;
            calculating a vapor fraction using the liquid molar weight and the vapor molar weight; and
            calculating a compositional wellstream for the production well using the vapor fraction; and
        evaluate the production well using the compositional wellstream.

7. The method of claim 1, wherein calculating the black oil wellstream into the compositional wellstream is further performed by:

calculating a liquid mass rate; and calculating a vapor mass rate, wherein calculating the vapor fraction uses the liquid mass rate and the vapor mass rate.

8. The non-transitory computer readable medium of claim 5, wherein calculating the black oil wellstream into the compositional wellstream is further performed by:

calculating a liquid mass rate; and calculating a vapor mass rate, wherein calculating the vapor fraction uses the liquid mass rate and the vapor mass rate.

9. The system of claim 6, wherein calculating the black oil wellstream into the compositional wellstream is further performed by:

calculating a liquid mass rate; and calculating a vapor mass rate, wherein calculating the vapor fraction uses the liquid mass rate and the vapor mass rate.

* * * * *